(12) United States Patent
Rad

(10) Patent No.: US 9,548,759 B1
(45) Date of Patent: Jan. 17, 2017

(54) SYSTEMS AND METHODS FOR PROCESSING LDPC CODES WITH DIFFERENT CIRCULANT SIZES

(71) Applicant: Marvell International Ltd., Hamilton (BM)

(72) Inventor: Farshid Rafiee Rad, Santa Clara, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 59 days.

(21) Appl. No.: 14/554,845

(22) Filed: Nov. 26, 2014

Related U.S. Application Data

(60) Provisional application No. 61/909,199, filed on Nov. 26, 2013.

(51) Int. Cl.
  *H03M 13/11* (2006.01)
  *H03M 13/37* (2006.01)

(52) U.S. Cl.
  CPC ....... *H03M 13/1125* (2013.01); *H03M 13/116* (2013.01); *H03M 13/3746* (2013.01)

(58) Field of Classification Search
  CPC .................................................... H03M 13/11
  USPC ........ 714/780, 752, 755, 810, 776, 774, 794
  See application file for complete search history.

(56) References Cited

U.S. PATENT DOCUMENTS

| | | | | |
|---|---|---|---|---|
| 6,757,122 B1* | 6/2004 | Kuznetsov | ......... | H03M 13/1131 360/46 |
| 8,347,200 B1* | 1/2013 | Jakka | ................. | H03M 13/1102 714/776 |
| 8,645,810 B2* | 2/2014 | Sharon | ............... | H03M 13/1128 714/755 |
| 8,769,380 B1* | 7/2014 | Burd | .................. | H03M 13/1128 714/774 |
| 8,918,694 B2* | 12/2014 | Morero | ............... | H03M 13/015 714/752 |
| 8,938,660 B1* | 1/2015 | Varnica | .................. | H03M 13/00 714/755 |
| 8,966,339 B1* | 2/2015 | Lu | ...................... | H03M 13/1117 714/758 |
| 2013/0031438 A1* | 1/2013 | Hu | ...................... | G06F 11/1012 714/752 |

* cited by examiner

*Primary Examiner* — Fritz Alphonse

(57) ABSTRACT

Systems and methods are provided for decoding low density parity check (LDPC) codes with different circulant sizes using common decoding circuitry. The systems and methods include receiving a plurality of codewords corresponding to an LDPC code and determining a circulant size associated with the plurality of received codewords. In response to determining the circulant size associated with the plurality of received codewords, the systems and methods partition processing resources of the common decoding circuitry into a plurality of cells based on the determined circulant size and processing the plurality of received codewords simultaneously using the plurality of cells.

20 Claims, 12 Drawing Sheets

SYSTEMS AND METHODS FOR PROCESSING LDPC CODES WITH DIFFERENT CIRCULANT SIZES

CROSS REFERENCE TO RELATED APPLICATION

This disclosure claims the benefit under 35 U.S.C. §119 (e) of U.S. Provisional Application No. 61/909,199, filed on Nov. 26, 2013, which is hereby incorporated by reference herein in its entirety.

FIELD OF USE

The present disclosure relates generally to error correcting systems and methods and, more particularly, to a unified architecture for processing LDPC codes with different circulant sizes.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

This disclosure relates generally to data decoding, and more particularly to a unified architecture for processing LDPC codes with different circulant sizes using a common decoding architecture.

LDPC codes have become an important component of some error correcting systems. LDPC codes may employ many different types of parity check matrices. For example, the structure of an LDPC code's parity check matrix may be random, cyclic, or quasi-cyclic. LDPC codes defined by quasi-cyclic parity check matrices are particularly common and computationally efficient. These codes are known as quasi-cyclic low density parity check (QC-LDPC) codes.

As used herein, the term "message" refers to a numerical value, usually representing a log likelihood ratio (LLR). An LDPC decoder may decode LDPC codes using an iterative message-passing algorithm, such as a min-sum decoding algorithm. Iterative algorithms of this type may decode a received codeword using an iterative process in which each iteration includes two update steps involving check nodes and variable nodes.

An LDPC decoder may further use a layered approach to decode LDPC codes, which is sometimes referred to as layered decoding. Layered decoding exploits the fact that a QC-LDPC code's parity check matrix consists of circular submatrices or so-called "circulants." The size of these circulants corresponds to the number of check node processors necessary to implement layered decoding and determines to what extent the processing of the parity check matrix can be parallelized. For example, a parity check matrix composed of circulants of size $S_c$ can be implemented using $S_c$ check node processors.

Within an LDPC decoder, the layered decoding approach for a QC-LDPC codeword may require a circular shifter to be used. The circular shifter may be responsible for shifting $S_c$ LLR messages, each from a different check node processor, in one layer of processing. The amount of shift to be applied by the circular shifter may be determined based on the maximum shift necessary for a message. At greatest, the maximum shift may be equal to $S_c$, the size of the circulants in the quasi-cyclic parity check matrix associated with the QC-LDPC code. In this case, a circular shifter that accepts $S_c$ inputs and provides $S_c$ outputs may be used to appropriately shift the LLR messages. This $S_c \times S_c$ circular shifter may be implemented using a barrel shifter that hierarchically shifts the input sequence of each of the LLR messages in $\lceil \log_2 S_c \rceil$ steps. The complexity of this circular shifter may therefore be proportional to $\lceil \log_2 S_c \rceil$.

The amount that the LLR messages must be shifted may be determined by the difference in shifts between the first non-zero circulant in the column associated with the grouped variable nodes to which the LLR messages are sent and the previous non-zero circulant in the same column of the quasi-cyclic parity check matrix in the mother matrix representation. LLR messages may be sent from, for example, a channel detector to a layered LDPC decoder in segments smaller than the circulant size $S_c$. LLR messages may be sent in this manner because of bandwidth constraints in the channel between a channel detector and a layered LDPC decoder. Subsequent shifting of LLR messages may be done by the circular shifter used in layered decoding.

In some scenarios, a user device may need to be able to process different types of LDPC codes, such as LDPC codes with different circulant sizes. For example, in some applications, different degrees of error protection may be desirable depending for different types of information that are being exchanged between a transmitter and a reference (e.g., control information versus user data). One way of achieving different degrees of error protection is to use LDPC codes with different parameters, such as LDPC codes with different circulant sizes. However, supporting the decoding of more than one LDPC code in a user equipment device comes at the expense of implementation complexity. In some implementations, this may require separate decoding hardware that is dedicated to each of the multiple LDPC codes.

In view of the above, there exists a need for reducing the complexity of decoder implementations that support the decoding of multiple LDPC codes. Such techniques have the benefit of increased computational efficiency, decreased routing congestion, and may lead to improved application performance.

SUMMARY OF THE DISCLOSURE

In accordance with an embodiment of the present disclosure, a method is provided for decoding low density parity check (LDPC) codes with different circulant sizes using common decoding circuitry. The method includes receiving a plurality of codewords and determining a circulant size associated with the plurality of received codewords. In response to determining the circulant size associated with the plurality of received codewords, the method partitions processing resources of the common decoding circuitry into a plurality of cells based on the determined circulant size and processes the plurality of received codewords using the plurality of cells.

In some implementations, a number of cells in the plurality of cells is selected to be equal to a number of codewords in the plurality of received codewords.

In some implementations, processing the plurality of received codewords includes processing the plurality of codewords using an iterative message passing algorithm.

In some implementations, the plurality of codewords corresponds to a first LDPC code and the plurality of codewords is of a first type. The method may further include receiving a codeword of a second type corresponding to a second LDPC code and determining a circulant size associated with the received codeword of the second type, wherein the circulant size associated with the received codeword of the second type is larger than the circulant size associated with the plurality of received codewords of the first type. In response to determining the circulant size associated with the received codeword of the second type, the method further processes the received codeword of the second type jointly using the partitioned processing resources of the common decoding circuitry.

In some implementations, the method processes the plurality of codewords simultaneously using the plurality of cells to obtain a plurality of processed codewords, and circularly shifts the plurality of processed codewords using a circular shifter based on the determined circulant size associated with the plurality of codewords.

In some implementations, the circulant size associated with the plurality of codewords is determined based on a control signal.

In some implementations, processing the plurality of codewords includes determining whether an early termination criterion is satisfied, wherein the early termination criterion is based on the circulant size associated with the plurality of codewords.

In accordance with an embodiment of the present disclosure, a system is provided for decoding low density parity check (LDPC) codes with different circulant sizes. The system may include common decoding circuitry configured to process a plurality of codewords. The system further includes control circuitry configured to receive a plurality of codewords and determine a circulant size associated with the plurality of received codewords. The control circuitry is further configured to partition processing resources of the common decoding circuitry into a plurality of cells based on the determined circulant size, in response to determining the circulant size associated with the plurality of received codewords, and cause the common decoding circuitry to process the plurality of received codewords using the plurality of cells.

In some implementations, a number of cells in the plurality of cells is selected to be equal to a number of codewords in the plurality of codewords.

In some implementations, the common decoding circuitry is further configured to process the plurality of codewords using an interactive message-passing algorithm.

In some implementations, the plurality of codewords corresponds to a first LDPC code, the plurality of codewords is of a first type, and the control circuitry is further configured to receive a codeword of a second type corresponding to a second LDPC code. The control circuitry may further be configured to determine a circulant size associated with the received codeword of the second type, wherein the circulant size associated with the received codeword of the second type is larger than the circulant size associated with the plurality of received codewords of the first type. The control circuitry may further be configured to cause the common decoding circuitry to process the received codeword of the second type jointly using the partitioned processing resources of the common decoding circuitry, in response to determining the circulant size associated with the received codeword of the second type.

In some implementations, the control circuitry is further configured to determine one of a first mode of operation and a second mode of operation, wherein the first mode of operation is associated with receiving a plurality of codewords associated with the first LDPC code, and the second mode of operation is associated with receiving a single codeword associated with a second LDPC code.

In some implementations, the first LDPC code is associated with a circulant size that is smaller than a circulant size associated with the second LDPC code.

In some implementations, the common decoding circuitry is further configured to process the plurality of codewords by processing the plurality of codewords simultaneously using the plurality of cells to obtain a plurality of processed codewords, and circularly shifting the plurality of processed codewords using a circular shifter based on the determined circulant size associated with the plurality of codewords.

In some implementations, the circulant size associated with the plurality of codewords is determined based on a control signal.

In some implementations, the control circuitry is further configured to determine whether an early termination criterion is satisfied, wherein the early termination criterion is based on the circulant size associated with the plurality of codewords.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

The present disclosure generally relates to error correcting systems and methods and, more particularly, to a unified architecture for processing LDPC codes with different circulant sizes. In applications or devices where information may be altered by interfering signals or other phenomena, error correcting codes, such as LDPC codes, may provide a measured way to protect information against such interference. As used herein, "information" and "data" refer to any unit or aggregate of energy or signals that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
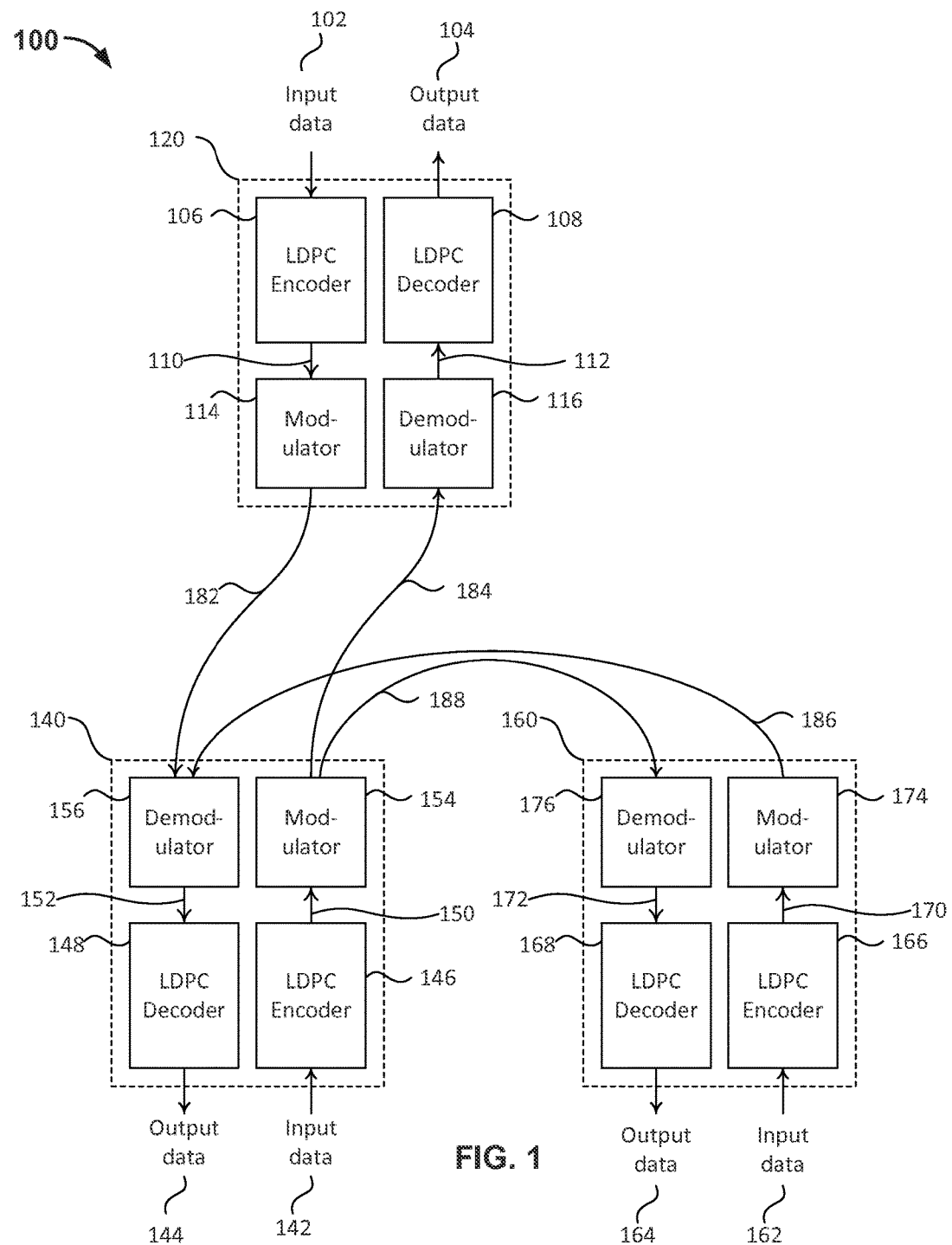
FIG. 1 illustrates a communication system that utilizes LDPC codes for error detection and correction to achieve reliable communication, in accordance with an embodiment of the present disclosure.

FIG. 1 shows an illustrative communication system 100 that utilizes LDPC codes for error detection and correction to achieve reliable communication, in accordance with an embodiment of the present disclosure. Communications system 100 may consist of three user equipment devices, e.g., user equipment devices 120, 140, and 160. Input data 102 may be encoded through encoder 106. Input data 102, often referred to as the message information or a message vector, may be grouped into units of k symbols, where each symbol may be binary, ternary, quaternary, or any other suitable type of data. However, for simplicity, embodiments of the present invention will be described in terms of binary symbols or bits. In the process of encoding input data 102, different codes may be used by LDPC encoder 106 to achieve different results.

As shown in FIG. 1, LDPC encoder 106 may encode input data 102 using a low density parity check (LDPC) code. The result of encoding input data 102 is codeword 110, also denoted as c. Codeword 110 may be of a predetermined length, which may be referred to as n, where n≥k.

In some implementations, codeword 110 may be passed to a modulator 114. Modulator 114 prepares codeword 110 for transmission on a communications channel, such as communication channel 182.

Modulator 114 may use phase-shift keying, frequency-shift keying, quadrature amplitude modulation, or any suitable modulation technique to modulate codeword 110 into one or more information-carrying signals. Channel 182 may represent media through which the information-carrying signals travel. For example, channel 182 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference, noise, and other types of phenomena, channel 182 may corrupt the waveform modulated by modulator 114. Thus, the waveform received by demodulator 116 may differ from the originally transmitted signal waveform. The received waveform may be demodulated with demodulator 116. Demodulator 116 may demodulate the received waveform with filters, by multiplication with periodic functions, or using any suitable demodulation technique corresponding to the type of modulation used in modulator 114. The result of demodulation is received vector 112, which may contain errors due to channel corruption.

Received vector 112 may then be processed by LDPC decoder 108. LDPC decoder 108 may be used to correct or detect errors in received vector 112. LDPC decoder 108 may use decoding hardware and a circular shifter. A circular shifter may be used by LDPC decoder 108 to decode a quasi-cyclic LDPC code. LDPC decoder 108 may also use an iterative message-passing algorithm or a form of layered decoding to correct or detect errors in received vector 112. LDPC decoder 108 may calculate a log-likelihood-ratio (LLR) message (also known as soft information). For example, LDPC decoder 116 may compute an LLR message using the equation $$LLR(b_i) = \log\frac{P(b_i = 0)}{P(b_i = 1)}$$

for each i, where $b_i$ may represent the i-th bit in received vector 112. LDPC decoder 108 may use the computed LLR messages in the iterative message-passing algorithm or in the layered decoding algorithm. When utilizing such an iterative algorithm, LDPC decoder 108 may perform several iterations of the algorithm until the output of LDPC decoder 108 converges to a valid codeword. In some instances, the output of LDPC decoder 108 may fail to converge to a valid codeword. Decoder failure may be caused by a variety of reasons. Because the output of LDPC decoder 108 may never converge to a valid codeword in certain situations, LDPC decoder 108 may be equipped with a maximum iteration limit, which may be any suitable predetermined number. When LDPC decoder 108 reaches the maximum iteration limit, LDPC decoder 108 automatically terminate operation and move on to the next received vector 112. However, if the output of LDPC decoder 108 successfully converges to a valid iterative codeword, LDPC decoder 108 may then output decoded information 104.

User equipment devices 140 and 160 may include similar components as user equipment device 120, such as modulators 154 and 174, LDPC encoders 146 and 166, demodulators 156 and 176, and LDPC decoders 148 and 168. In some embodiments, different types of information may be exchanged between different pairs of user equipment devices. For example, user equipment device 120 may be responsible for coordinating transmissions among other user equipment devices (e.g., user equipment devices 140 and 160) by exchanging control information with user equipment device 140 and user equipment device 160, respectively. The control information may enable user equipment devices 140 and 160 to exchange information directly between one another, without the need of relaying information through user equipment device 120. Accordingly, exemplary communication links 182 and 184 may carry control information whereas communication links 186 and 188 may carry user data.

In some aspects, communication system 100 may be similar to a system that uses a standard developed by the Multimedia on Coax Alliance (MoCA). A system based on the MoCA standard (also referred to as a MoCA-based system) generally includes a user equipment device that assumes the role of "network coordinator," such as user equipment device 120. A network coordinator may coordinate access to a transmission medium for a predefined number of nodes, such as up to eight devices in a typical MoCA-based system. The network coordinator may transmit and receive control information from the user equipment devices it is controlling, and this control information may be encoded using a first LDPC code with a first circulant size. For example, a MoCA-based system may encode control information using a code rate of 75% using a code with circulant size of 12. The control transmissions sent and received by the network coordinator may instruct user equipment devices controlled by the network coordinator (e.g., user equipment devices 140 and 160) to exchange user data directly between each other. In contrast, user data may be encoded differently than control information, e.g., to achieve a different degree of error protection. For example, a second LDPC code with a second circulant size may be used. For example, a MoCA-based system may encode user data with a code rate of 85% and use an LDPC code with circulant size of 100.

In some embodiments, the LDPC codes processed by LDPC encoders 106, 146, and 166 of FIG. 1 and LDPC decoders 108, 148, and 168 of FIG. 1 are represented by mathematical vector models. In particular, an LDPC code may be described by its parity check matrix H. The parity check matrix H may be of size r×n, corresponding to codewords of length n and syndromes of length r. The syndrome length r may satisfy the inequality r≥n−k, where k is the length of the information being encoded (e.g., the length of input data 102 in FIG. 1). When parity check matrix H is multiplied by codeword c, the result is a zero-vector of size r, i.e., a column vector with r entries that are all equal to zero. Parity check matrix H has a maximum column weight defined to be the maximum of the number of nonzero entries in each column of parity check matrix H. Parity check matrix H may be chosen, for example, to be computationally convenient or to decrease the number of errors generated by the message-passing algorithm in LDPC decoder 108.

Figure 2:
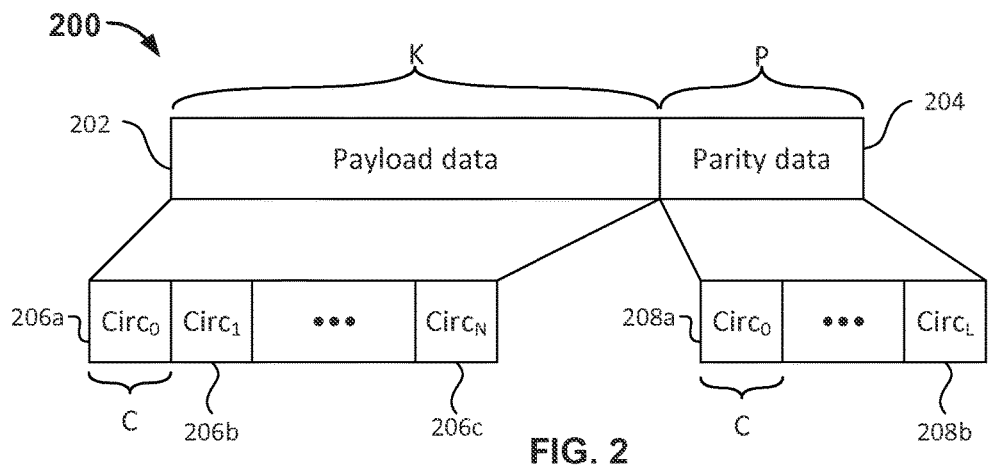
FIG. 2 shows an illustration of a codeword associated with a quasi-cyclic LDPC code, in accordance with some embodiments of the present disclosure.

FIG. 2 shows an illustration of a codeword 200 associated with a quasi-cyclic LDPC code, in accordance with some embodiments of the present disclosure. Codeword 200 may include payload data 202 and parity data 204. Payload data 202 may correspond to user data, control data, or other information bits that are to be encoded and decoded using LDPC encoder 106 and LDPC decoder 108, respectively. For example, payload data 202 may correspond to a portion of input data 102. In some embodiments, payload data 202 may consist of a fixed number of bits or symbols, such as to facilitate encoding with one or more predetermined LDPC codes. In some aspects, this fixed number may be denoted as K and may be determined to be well-suited for a specific LDPC code. If input data 102 has a size that exceeds K, then input data 102 may be partitioned into a number of segments, each of length K. Alternatively, if input data 102 has a size that is smaller than K, then logical zeroes (or another predefined bit or symbol) may be appended to the input data such that the padded segment is of size K.

Codeword 200 may further include parity data 204, consisting of a total of P bits. Parity data 204 may be generated by LDPC encoder 106 based on payload data 202. LDPC decoder 108 may use a received version of payload data 202 and parity data 204 to perform decoding and error correction of payload data 202.

Payload data 202 and parity data 204 may both be composed of circulants of a predetermined size. For example, payload data 202 may consist of N circulants, and parity data 204 may consist of L circulants. Different LDPC codes may be defined by choosing N and L, i.e., the length of payload data 202 and/or parity data 204 to consist of a different number of circulants, or by modifying the circulant size $S_c$. For example, in the MoCA standard, two types of codes may be defined, a "long" LDPC code and a "short" LDPC code. For the long LDPC code, payload data 202 may consist of $N_1=39$ circulants, and parity data 204 may consist of $L_1=7$ circulants. The long LDPC code may further be associated with a circulant size of $C_1=100$ bits, and therefore payload data 202 may consist of a total of 3,900 bits, and parity data 204 may consist of a total of 700 bits. In this example, codeword 200 would thus have a length of 4,600 bits. The code rate of the long LDPC code may therefore correspond to approximately 85% (i.e., the codeword size of 4,600 bits divided by the size of parity data 204). In contrast, for the short LPPC code, payload data 202 may consist of $N_2=36$ circulants of size $C_2=12$ each. Parity data 204 may in turn consist of $L_2=12$ circulants of size $C_2=12$ each. Accordingly, payload data 202 may have a size of 432 bits, and parity data 204 may have a total size of 144 bits. The total size of codeword 200 may thus be equal to 576 bits. The code rate may equal 85% (i.e., the codeword size of 576 bits divided by the size of parity data 204).

Figure 3:
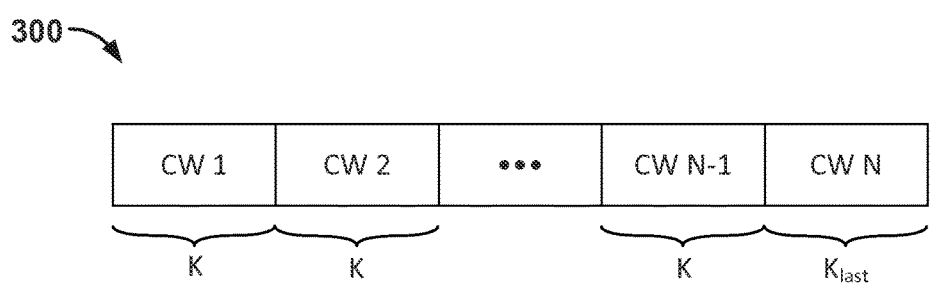
FIG. 3 shows an illustration of a data packet that consists of a number of codewords, in accordance with an embodiment of the present disclosure.

FIG. 3 shows an illustration of a data packet 300 that consists of a number of codewords, in accordance with an embodiment of the present disclosure. Codeword 300 may include a total number of N codewords. All but the last codeword may include a fixed number of bits as payload data, e.g., K bits. The N-th codeword may include a smaller number of bits, $K_{last}$, for example, when the total length of input data 102 is not divisible by K, the length of payload data 202. In some embodiments, data packet 300 may be used for communication using the long LDPC code defined by the MoCA standard. For example, codeword 300 may be used for data communication between user equipment devices 140 and 160 of FIG. 1.

Figure 4:
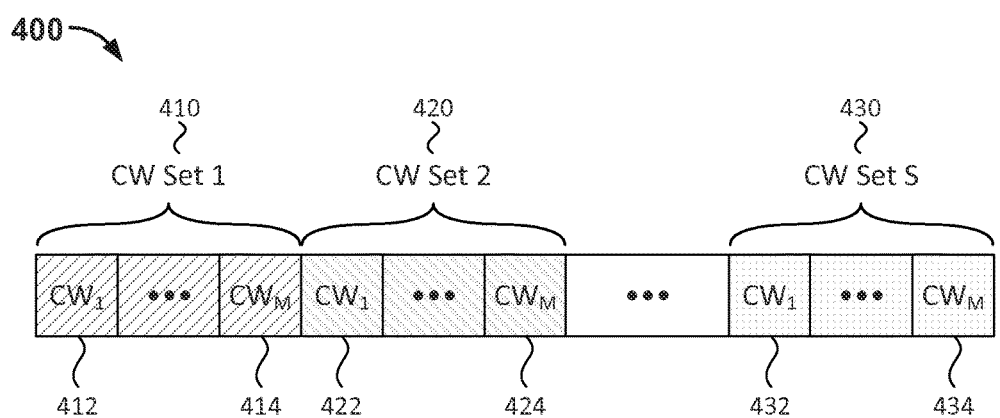
FIG. 4 shows an illustration of a control packet that consists of a number of codeword sets, each including a number of codewords, in accordance with an embodiment of the present disclosure.

FIG. 4 shows an illustration of control packet 400 that consists of a number of codeword sets, each including a number of codewords, in accordance with an embodiment of the present disclosure. Control packet 400 may include a total of S codeword sets, such as codeword sets 410, 420, and 430. Each of the codeword sets may consist of M codewords, where M is a predefined number. In some embodiments, control packet 400 may correspond to control packets that are exchanged between user equipment device 120 and user equipment devices 140 and 160 in FIG. 1, e.g., in accordance with the MoCA standard. In some aspects, the M may correspond to the number of user equipment devices that are managed by a user equipment device that assumes the role of network coordinator, e.g., user equipment device 120.

Figure 5:
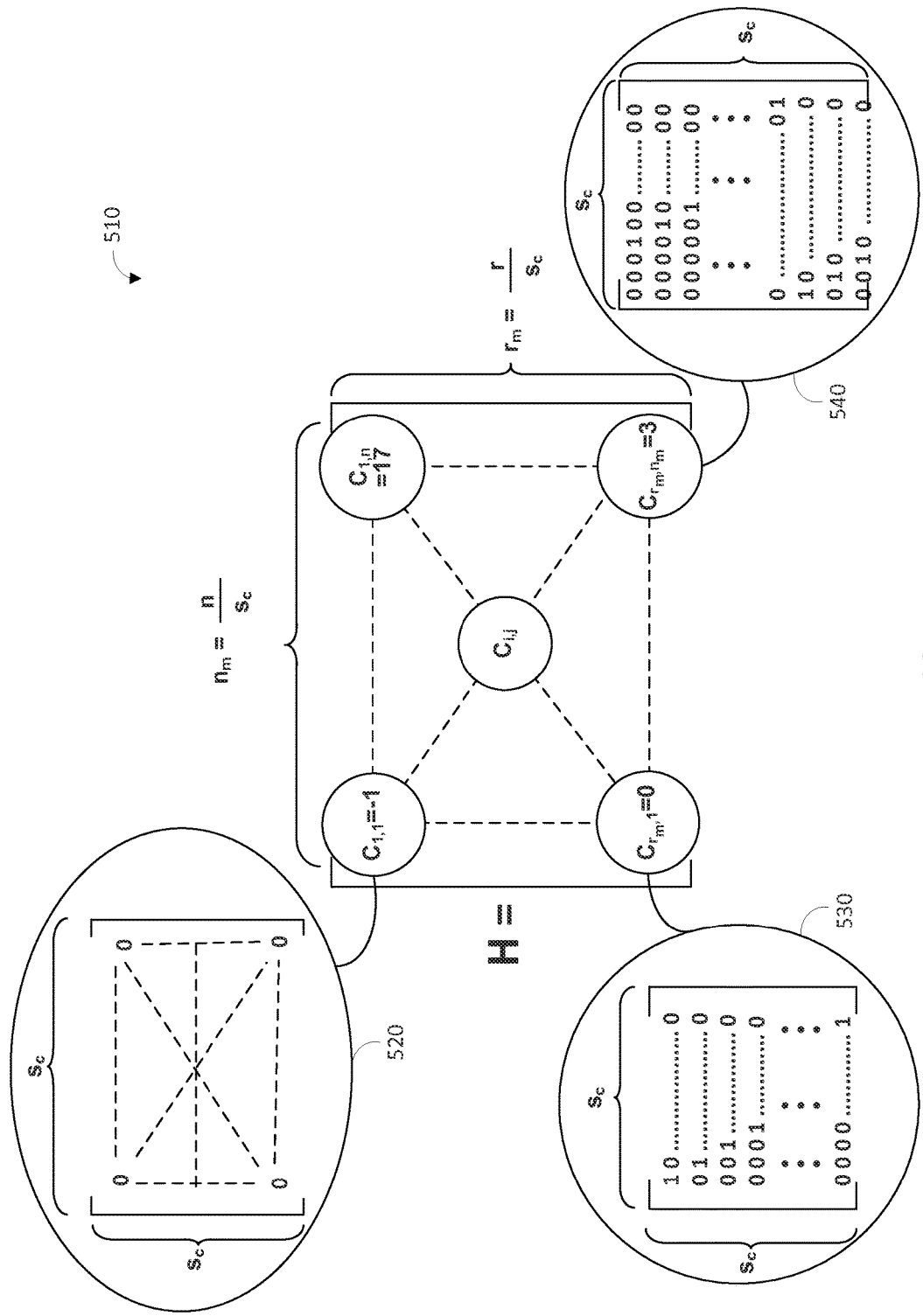
FIG. 5 shows an illustrative example of quasi-cyclic parity check matrix in a shift notation, in accordance with some embodiments of the present disclosure.

FIG. 5 shows an illustrative example of quasi-cyclic parity check matrix 510 in a shift notation, in accordance with some embodiments of the present disclosure. A shift representation (or shift notation) of the parity check matrix is a compact way of representing the matrix, which may contain a large number of elements. The parity check matrix in shift notation may also be referred to as shift matrix for brevity. The shift representation is equivalent to the normal matrix representation, but may be advantageous in illustrating the structure of a possibly large matrix without the necessity of explicitly listing each element in the matrix.

A parity check matrix of a quasi-cyclic LDPC code has the property that the parity check matrix is quasi-cyclic. A quasi-cyclic parity check matrix is composed of circular submatrices, which are also known as circulants. Circulant 540 is one such matrix. Circulant 540 is a square matrix, i.e., circulant 540 has the same number of rows as columns. The number of rows and columns of circulant 540 is commonly referred to as the circulant size $S_c$. In addition, circulants have the property that for any positive integer $C_{i,j}<S_c$, any row or column of the circulant may be cyclically shifted by $C_{i,j}$ positions to obtain another row or column. The value of non-negative entries in quasi-cyclic parity check matrix 510 (using shift notation) specifies the corresponding circulant submatrix in terms of a "shift," $C_{i,j}$, relative to the identity matrix. For example, the number zero represents identity matrix 530 of size $S_c$, and the number three represents matrix 540 which is identity matrix 530 with each row cyclically shifted to the right by three positions. As a matter of notation, minus-one denotes the all-zero matrix 520. For brevity, the phrase "non-zero circulant" will be used to refer to any circulant matrix that is not the all-zero matrix. Since parity check matrix 510 is of size r×n, the size of the shift matrix is $r_s \times n_s$, where $r_m = r/S_c$, $n_m = n/S_c$ and $S_c$, r, and n are chosen so that $r_s$ and $n_s$ are integers.

If a shift representation of the parity check matrix is used, then the implementation of LDPC encoder 106 and of LDPC decoder 108 may be significantly simplified. One reason for this is that parity check matrix 510 may be much easier to store, since only the first row/column of each circulant matrix needs to be stored in order to generate the entire circulant. If the circulant is sparse (has low row/column weight) then it may be stored by simply storing the positions of the one-bits in its first row (or first column). Furthermore, by using a quasi-cyclic representation of parity check matrix, the storage of the messages used during the decoding of a LDPC vector within LDPC decoders may also be made more compact and parallelization in the encoder/decoder may be achievable with simple shifting operations, since adjacent rows (or adjacent columns) corresponding to the same circulant are cyclic shifts of each other. In addition, for some quasi-cyclic LDPC codes, encoding and decoding can be further simplified by efficient address generation.

Figure 6:
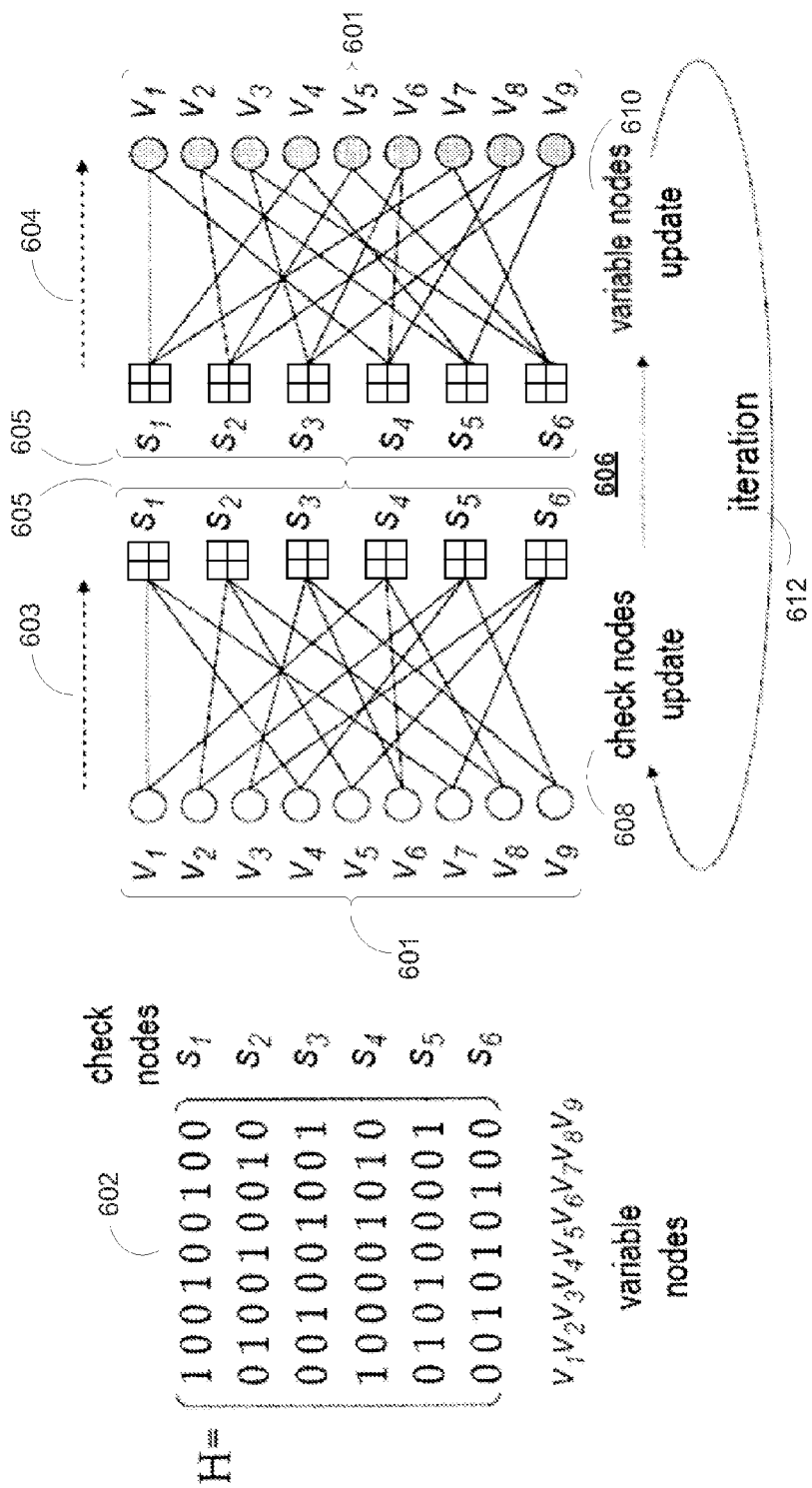
FIG. 6 shows a graphical illustration of a parity check matrix and an iterative message-passing algorithm corresponding to the parity check matrix in accordance with some embodiments of the present disclosure.

FIG. 6 shows graphical illustration 600 of a parity check matrix and iterative message-passing algorithm corresponding to the parity check matrix in accordance with some embodiments of the present disclosure. An LDPC code may be graphically represented by a Tanner graph, a bipartite graph showing the relationship between an LDPC code's codeword bits and parity check equations. The advantages of using a Tanner graph of an LDPC code may include access to efficient graph-based message-passing algorithms for decoding. There are two types of nodes shown in Tanner graphs 603 and 604. Variable nodes 601 represent each position in codeword 110 and are denoted by circles. Thus, there may be n variable nodes. Variable nodes may also be referred to as symbol or bit nodes. Check nodes 605 may represent each syndrome (parity check equation) of LDPC code. For example, there may be n−k check nodes. Check nodes are denoted by squares.

Tanner graphs 603 and 604 correspond to parity check matrix 602. The check nodes and variable nodes of Tanner graphs 603 and 604 may correspond to the rows and columns of parity check matrix 602, respectively. The undirected edges connecting check nodes with variable nodes may correspond to the locations of the non-zero entries of parity check matrix 602. In other words, parity check matrix 602 may be the adjacency matrix of Tanner graphs 603 and 604. For example, the "1" at the (1,1) location and the "0" at the (1,2) location of parity check matrix 602 may indicate that there is an edge between check node $S_1$ and variable node $V_1$, and that there is no edge between check node $S_1$ and variable node $V_2$, respectively. Therefore, if there are $d_v$ entries equal to "1" in a given column of parity check matrix 602, then there are $d_v$ edges emanating from the variable node corresponding to that column. Equivalently, the variable node corresponding to that column may have a degree of $d_v$. Similarly, if there are $d_c$ entries equal to "1" in some given row of parity check matrix 602, then there may be $d_c$ edges emanating from the check node corresponding to that row. Equivalently, the check node corresponding to that row may have a degree of $d_c$.

The check nodes (e.g., check nodes 605) of a Tanner graph may either be satisfied or unsatisfied, where a satisfied node has a binary value of "0" and an unsatisfied node has a binary value of "1". A check node may be satisfied (i.e., equal to "0"), if the values of the variable nodes connected to the check node sum to an even number. In other words, the value of each check node may be equal to the sum modulo two of the value of the variable nodes to which it is connected. For example, check node $S_2$ of Tanner graphs 603 and 604 may be satisfied if the values of variable nodes $V_2$, $V_5$, and $V_8$ sum to an even number. Furthermore, when a check node is unsatisfied, at least one of the variable nodes connected to it may be in error. Thus, the value of the check nodes (or equivalently, the value of the syndrome produced by parity check matrix 602) may provide a parity check on each codeword received by an LDPC decoder (i.e., LDPC decoder 108 of FIG. 1), thereby providing error correction capability to communication system 100 of FIG. 1.

Tanner graphs 603 and 604 may be used to illustrate an iterative two-step decoding algorithm known as message-passing algorithm 606 employed by, for example, LDPC decoder 108 of FIG. 1. The message-passing algorithm may perform several rounds (or iterations) of message updates in accordance with the structure of the Tanner graph associated with the parity check matrix of the LDPC codes to be decoded.

The message-passing update steps in message-passing algorithm 606 employed by, for example LDPC decoder 108, may be scheduled in multiple ways. For example, each iteration 612 of message-passing algorithm 606) may include processing several check nodes. For example, in the first iteration, some of the check nodes 605 (for example, check nodes $S_1$ and $S_2$) may request that some of variable nodes 601, to which they are connected, send their current messages to these check nodes. Check nodes $S_1$ and $S_2$ may then perform update 608 by carrying out computations based on the messages that they receive and a set of update rules. Then, check nodes $S_1$ and $S_2$ may send their current messages to the variable nodes to which they are connected. The variable nodes connected to check nodes $S_1$ and $S_2$ (i.e., variable nodes $V_1$, $V_4$, $V_7$ and nodes $V_2$, $V_5$, and $V_8$) may then perform update 610 by carrying out computations based on the messages that they receive and a set of update rules.

Then, for example, in the next iteration, some of the check nodes 605 (for example, check nodes $S_3$ and $S_4$) may request that the variable nodes connected to these check nodes send their current messages to these check nodes. Check nodes $S_3$ and $S_4$ may then perform update 608 by carrying out computations based on the messages that they receive and a set of update rules. Then, check nodes $S_3$ and $S_4$ may send their current messages to the variable nodes to which they are connected. Variable nodes connected to check nodes $S_3$ and $S_4$ (i.e., nodes $V_3$, $V_6$, $V_9$ and nodes $V_1$, $V_6$, and $V_8$) may then perform update 610 by carrying out computations based on the messages that they receive and a set of update rules. The same process may be repeated for check nodes $S_5$ and $S_6$.

Iteration 612 may be repeated until either the codeword has been decoded or until a threshold number of iterations has been reached. The messages that are sent during each step of each iteration of message-passing algorithm 606 may depend on the update rules and the scheduling of the update steps.

Prior to the first iteration of message-passing algorithm 606, each of the variable nodes 601 of FIG. 6 may receive an LLR message based on information from received vector 112 in FIG. 1. As discussed above, each iteration of message-passing algorithm 606 may include two operations. In one operation, check nodes may update and in the second step variable nodes may update. This process may be repeated until either the codeword has been decoded or until a threshold number of iterations has been reached.

For example, in the one operation, a group of variable nodes within the set of variable nodes 601 may send their current messages to a group of check nodes (e.g., to be processed in the first layer of message-passing decoding) within the set of check nodes 605 to which they are connected. The group of check nodes may then perform update 608 by carrying out computations based on the messages that they receive and a set of update rules. For example, these check nodes may receive $d_c$ messages each from a different variable node to which it is connected. Each message sent from the group of variable nodes to the group of check nodes may be labeled as a Q-type message. Each a posteriori probability (APP) message computed for the group of variable nodes may be labeled as P-type message. Q-type or P-type messages may be stored in the LDPC decoder's memory.

For example, these messages may be labeled $Q_1$ through $Q_4$. The group of check nodes may then update by computing an R-type message using each Q-type message it received and a minimum (min) approximation. Specifically, using all of the Q-type messages it received, each of the check nodes in the group of check nodes may compute an R-type message based on the equations $$\tanh\frac{R}{2} = \prod_{k=1}^{d_c-1} \tanh\frac{Q_k}{2},$$

which may be approximated using min approximation $$R \approx \min(Q_k, \ldots, Q_{d_c-1}) \prod_{k=1}^{d_c-1} \text{sign}(Q_k).$$

The $Q_k$ messages (i.e., a number k of Q-type messages) may be read directly from the memory of the iterative decoder or may be reconstructed. The $Q_k$ messages may be reconstructed from the $P_k$ messages (i.e., a number k of P-type messages) and the previous R-type messages that may be read from the memory of the LDPC decoder. These newly computed R-type messages may be sent to each of the variable nodes to which the check node is connected.

In the second operation, a group of check nodes within the set of check nodes 605 may send their current message to a group of variable nodes within the set of variable nodes 601 to which they are connected. The group of variable nodes may then perform update 610 by carrying out computations based on the messages that they receive and a set of update rules. For example, these variable nodes may receive $d_v$ messages each from different check nodes to which it is connected. Each message sent from the group of check nodes to the group of variable nodes may be labeled as an R-type message. For example, the messages sent from check nodes to a variable node may be labeled $R_1$ through $R_{d_v}$. The group of variable nodes may then update by computing a Q-type message using each R-type message it received. Specifically, using the initially received LLR message, and each of the R-type messages received, each variable node of the group of variable nodes may compute a Q-type message based on the equation $$Q = LLR + \sum_{j=1}^{d_v-1} R_j.$$

Similarly, message update steps may be performed to compute a P-type message (also known as an a posteriori probability (APP) message). Using the initially received LLR message and each of the R-type messages received, each variable node of the group of variable nodes may compute a P-type message 615 based on the equation $$P = LLR + \sum_{j=1}^{d_v} R_j.$$

In addition, each variable node of the group of variable nodes may also compute an extrinsic message $LLR_{EXT}$ based on the equations $$LLR_{APP}(v) = LLR + \sum_{j=1}^{d_v} R_j.$$

and $$LLR_{EXT}(v) = LLR_{APP}(v) - LLR.$$

Some or all of these newly computed messages may be sent to each of the check nodes to which the variable node is connected.

The design of message-passing algorithm 606 may be modified to decode a QC-LDPC code in a more efficient manner. In particular, the schedule of update steps in message-passing algorithm 606 may be altered to exploit the quasi-cyclic nature of the parity check matrix associated with the QC-LDPC code. To decode a QC-LDPC code, message-passing algorithm 606 may make use of a circular shifter.

Figure 7:
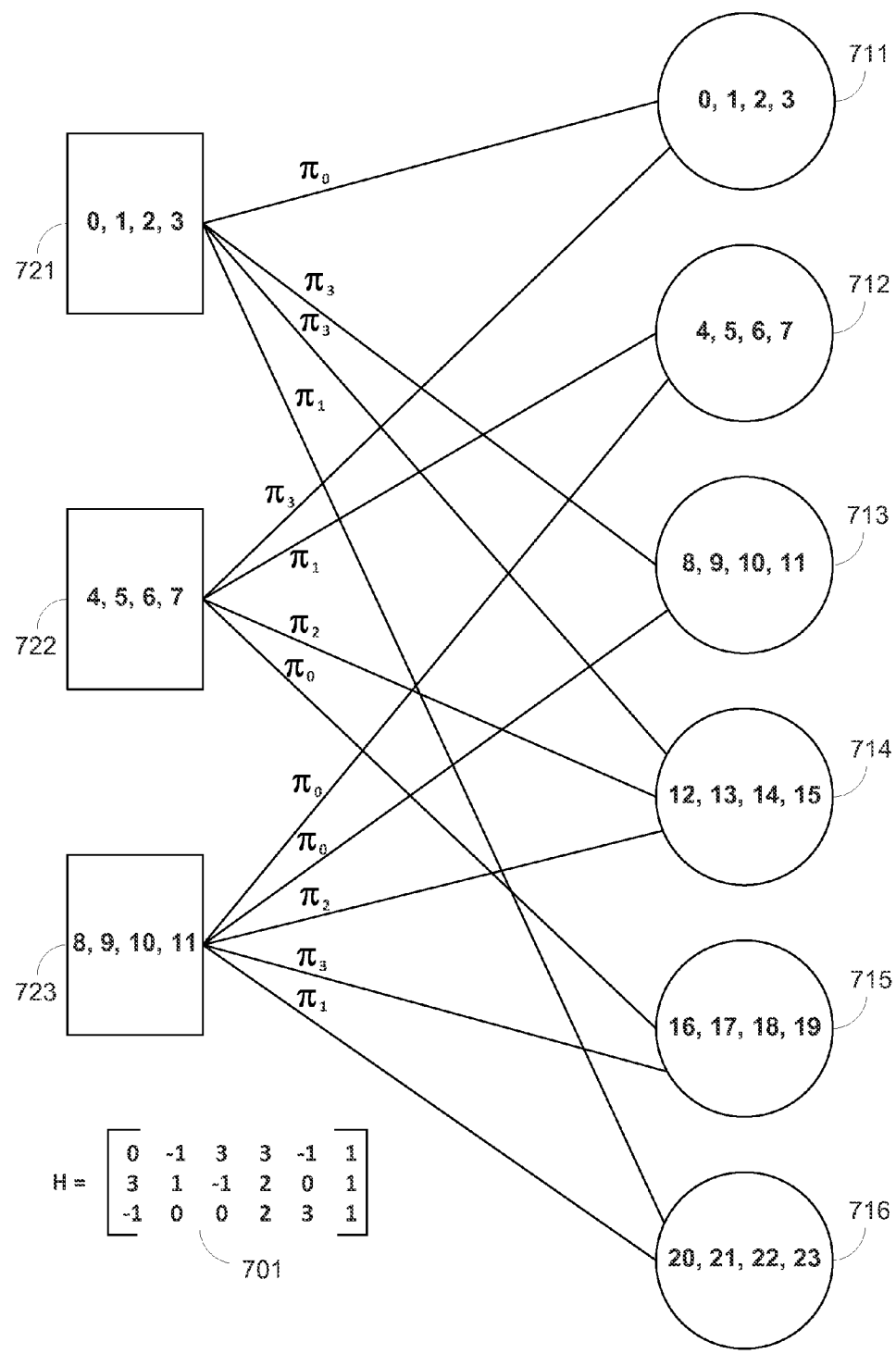
FIG. 7 shows a graphical illustration of a QC-LPDC code's quasi-cyclic parity check matrix and a bi-partite graph illustrating the use of parallel processing in the layered approach used to decode the QC-LDPC code in accordance with some embodiments of the present disclosure.

FIG. 7 shows graphical illustration 700 of a QC-LPDC code's quasi-cyclic parity check matrix 701 in a shift representation and a bi-partite graph illustrating the use of parallel processing in the layered approach used to decode the QC-LDPC code in accordance with some embodiments. Graph 700 includes grouped check nodes 721, 722 and 723 and grouped variable nodes 711, 712, 713, 714, 715, and 716. The edges between the grouped check nodes and the grouped variable nodes may represent possible permutations, $\pi_i$, of a plurality of edges generated based on a non-zero circulant in quasi-cyclic parity check matrix 701. In other words, the non-zero circulant may be the adjacency matrix of the sub-graph of connections between each group of check nodes and each group of variable nodes. To decode a QC-LDPC code, particular layers or groups of check nodes may update in parallel. To accomplish this, check nodes associated with a particular row in quasi-cyclic parity check matrix 501, in a shift representation, may be grouped together. This process may result in grouped check nodes 721, 722, and 723. For example, check nodes associated with the first four rows of the QC-LDPC code's parity check matrix, labeled 0, 1, 2, and 3, may be combined into grouped check nodes 721 and may be updated at substantially the same time (i.e., processed in parallel, for example, in the first layer of decoding). Variable nodes associated with a particular column in quasi-cyclic parity check matrix 701, in a shift representation, may be grouped together. This process may result in grouped variable nodes 711, 712, 713, 714, 715, and 716.

Processing for and updating of all check nodes in grouped check nodes 721, 722, or 723 may be done in parallel. Similarly, processing for and updating of all variable nodes in grouped variable nodes 711, 712, 713, 714, 715, and 716 may also be done in parallel. The processing of neighboring grouped check nodes and grouped variable nodes in this way may allow for reduced-complexity circular shifter design. To decode a QC-LDPC code using layered decoding, the fundamental principles of message-passing algorithm 600 of FIG. 6 may be used. This process of decoding a QC-LDPC code will be explained further below.

Figure 8:
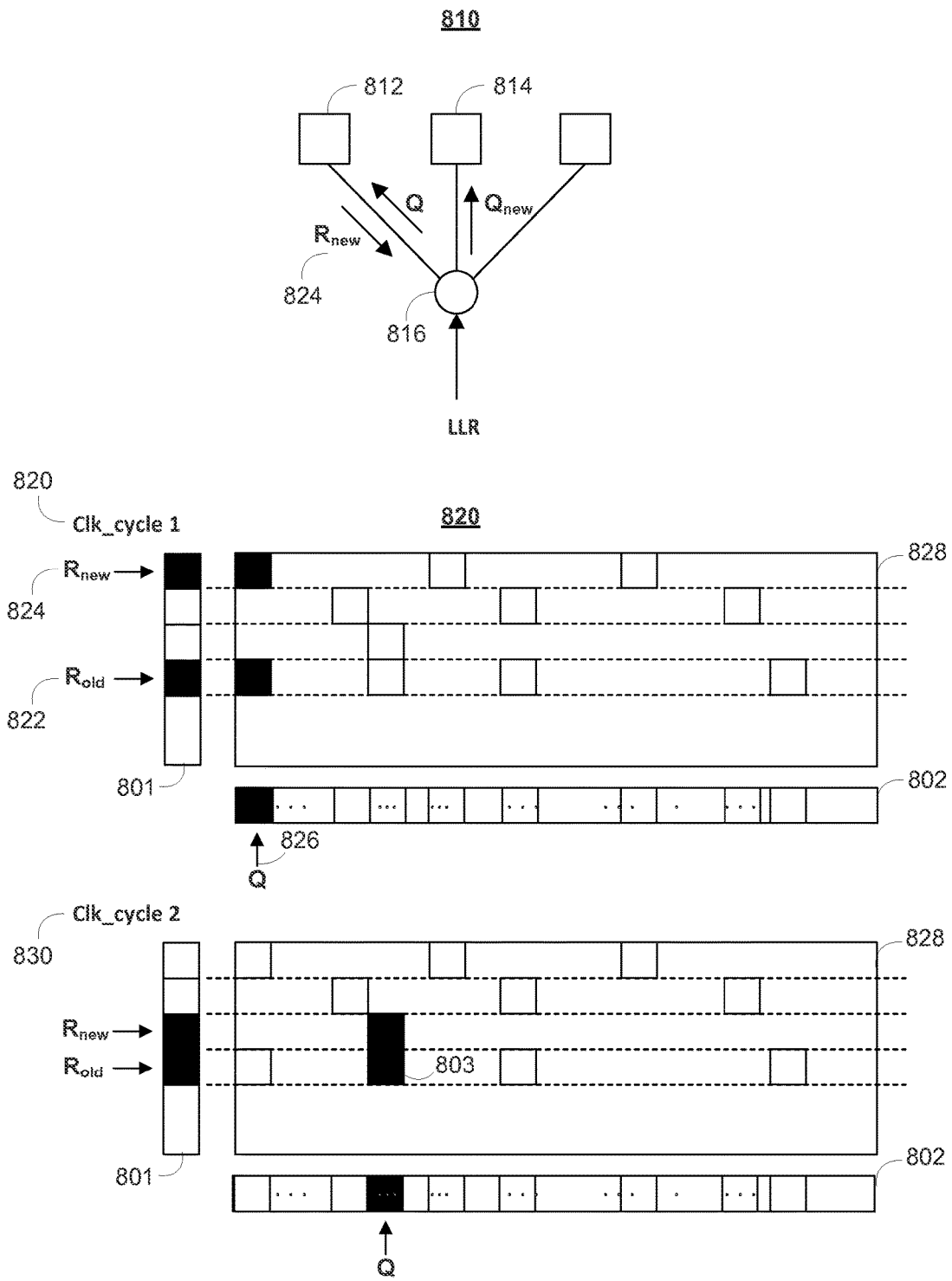
FIG. 8 shows a graphical illustration of the scheduling of update steps in the layered approach to decoding a QC-LDPC code and a graphical illustration of reading and writing from and to decoder memory when the update steps are performed in accordance with some embodiments of the present disclosure.

FIG. 8 shows graphical illustration 810 of the scheduling of update steps in the layered approach to decoding a QC-LDPC code and graphical illustration 820 of reading and writing from and to decoder memory when the update steps are performed in accordance with some embodiments. In illustration 810, grouped variable nodes 816 are denoted by a circle. In illustration 810 grouped check nodes 812 and grouped check nodes 814 are denoted by squares. Illustration 820 shows the reading and writing of R-type and Q-type messages from memory and to memory when layered decoding is used. Illustration 820 shows quasi-cyclic parity check matrix 828 in shift representation. Illustration 820 shows R memory 801 and Q memory 802 associated with these parity check matrices. The organization of the memory locations in R memory 801 and Q memory 802 may be governed by a parity check matrix in a shift representation.

Each square within R memory 801 may represent a memory location for data used to derive R-type messages (e.g., R-type messages 824 or R-type messages 822) of grouped check nodes represented by a row of the quasi-cyclic parity check matrix in a shift representation (e.g., parity check matrix 828). For example, each memory location may contain data values Min1 (M1), Min2 (M2), Min1Index, Min2Index, and AccumulatedSign. Min1 may correspond to the smallest value of the absolute value of all Q-type messages associated with non-zero circulants in the corresponding row of the quasi-cyclic parity check matrix in a shift representation and Min1Index may be the column location of this Q-type message. Similarly, Min2 may correspond to the next smallest value of the absolute value of all Q-type messages associated with non-zero circulants in the corresponding row of the quasi-cyclic parity check matrix in a shift representation and Min2Index may be the column location of this Q-type message. The value of AccumulatedSign is the product of the signs of all Q-type messages associated with non-zero circulants in the corresponding row of the quasi-cyclic parity check matrix in a shift representation. These data values may be used to derive an R-type message (e.g., based on the min approximation discussed above). Each square within Q memory 802 may represent memory locations for the Q-type or P-type messages (e.g., Q-type messages 826) of grouped variable nodes represented by a column of the quasi-cyclic parity check matrix in a shift representation (e.g., parity check matrix 828). In performing the update steps in the layered approach to decoding a QC-LDPC code, messages may be read from or written to these memory locations.

Each row of quasi-cyclic parity check memory matrix 828 may correspond to both grouped check nodes as well as a layer to be processed during layered decoding. For example, during clock cycle 820 of layered decoding the fourth row of quasi-cyclic parity check matrix 828 may be processed. The data in the memory location corresponding to the fourth row of parity check matrix 828 may be read from R memory 801, and previous R-type messages 822, $R_{old}$, may be derived from the stored data. Next, Q-type messages 826 in the first column in Q memory 802 may be read from memory. These messages may be associated with the column containing the first non-zero circulant in the fourth row of parity check matrix 828. The data in the memory location corresponding to the first row of parity check matrix 828 may then be read from R memory 801, and R type messages 824, $R_{new}$, may be derived from this data. The first row of the first column of parity check matrix 828 may correspond to the first non-zero circulant previous to the non-zero circulant in the fourth row (the layer currently being processed) of the same column.

Using this information, each of the variable nodes in the grouped variable nodes associated with the first column of parity check matrix 828 may each compute a Q-type or a P-type message. For example, each of these variable nodes may compute the a posteriori probability message $P=Q+R_{new}$. These variable nodes may then compute $Q_{new}=P-R_{old}$. Prior to computing $Q_{new}$, the computed P message may have to be circularly shifted to align the P and $R_{old}$ messages. This may be done, for example, using the circular shifter used by the layered LDPC decoder. The shift amount may be determined by the delta shift matrix and, in particular, the difference in shift between the first row and fourth row in the first column of parity check matrix 828. The delta shift matrix will be discussed further below.

The grouped variable nodes associated with the first column of parity check matrix 828 may then store the computed $Q_{new}$ messages in the associated location in Q memory 802. These $Q_{new}$ messages may be sent to the grouped check nodes associated with the fourth row of parity check matrix 828 (the current layer being processed). Using the $Q_{new}$ messages, these grouped check nodes may update and buffer the data values Min1 (M1), Min2 (M2), Min1Index, Min2Index, and AccumulatedSign. Processing may then continue in the clock cycle 830 using the values for Q-type messages and $R_{old}$ messages associated with the column containing the second non-zero circulant in the fourth row of parity check matrix 828 (e.g., the column associated with circulant 803). At the end of processing the fourth layer the updated buffered values for Min1 (M1), Min2 (M2), Min1Index, Min2Index, and AccumulatedSign may be written to the associated location in R memory 801.

Figure 9:
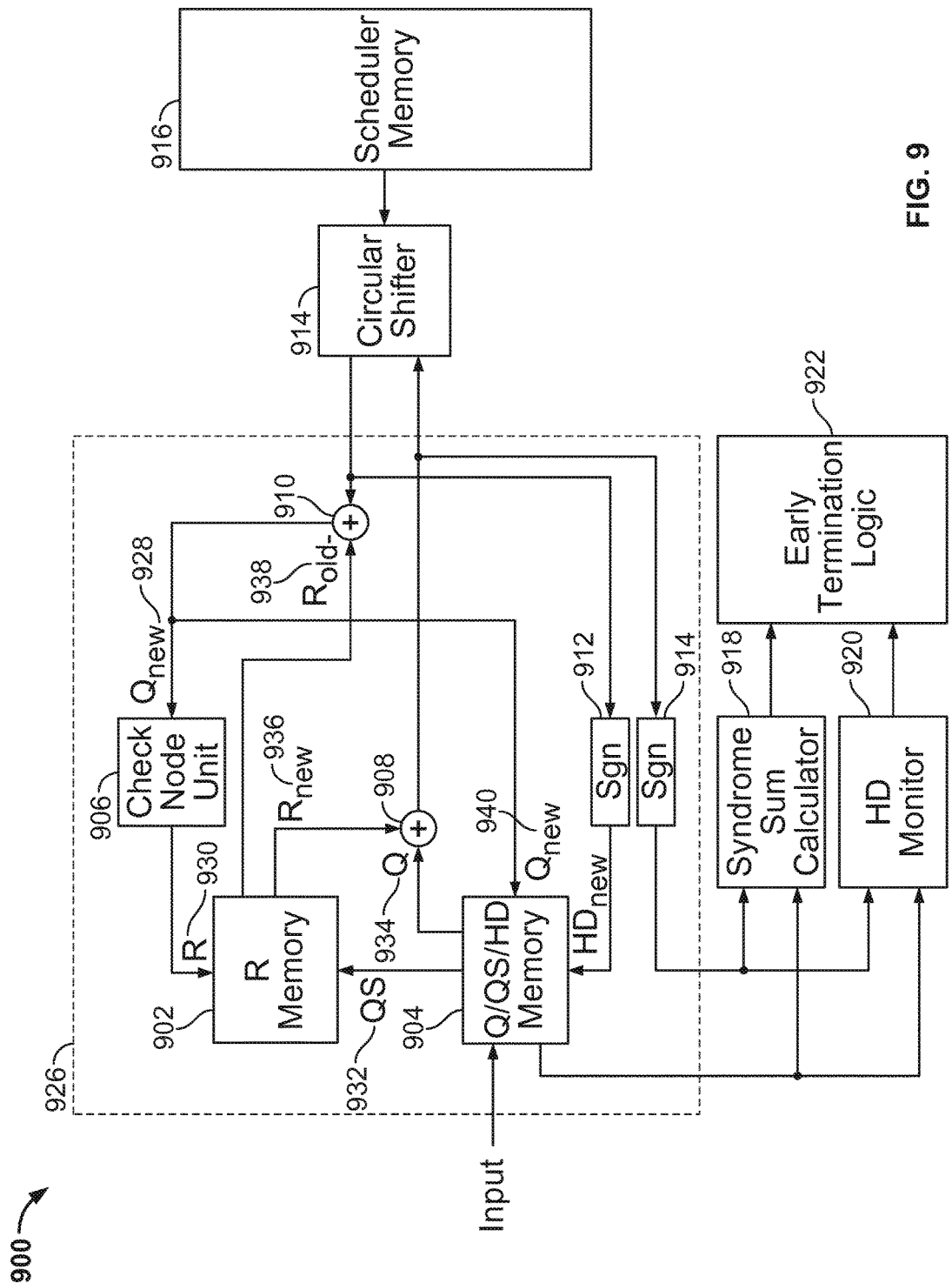
FIG. 9 shows a simplified block diagram of a layered LDCP decoder with a circular shifter in accordance with some embodiments of the present disclosure.

FIG. 9 shows a block diagram 900 of layered LDPC decoder 900 with circular shifter 914, in accordance with some embodiments of the present disclosure. Layered LDPC decoder 900 includes Q memory 904, R memory 902, circular shifter 914, adder 908, subtractor 910, check node unit 906, sign determination units 912 and 914, syndrome sum calculator 918, hard decision monitor 920, early termination logic 922, and scheduler memory 916. Layered LDPC decoder 900 may process a received codeword, such as received codeword 112 in FIG. 1.

Q memory 904 may be used for storing Q-type messages and for outputting an appropriate Q-type message to adder 908. R memory 902 may be used for storing data used to derive R-type messages, such as Min1, Min2, Min1Index, Min2Index, and AccumulatedSign. R memory 902 may further output appropriate data to adder 908 and subtractor 910. Adder 908 may add a Q-type message and an R-type message, corresponding to a value $R_{new}$, and compute the P-type message as $P=Q+R_{new}$, as is discussed in relation to FIG. 8. This P-type message may be input to circular shifter 914. Circular shifter 914 may be used to cyclically shift the bits of the P-type message it receives from adder 908 so that the bits may be aligned with corresponding bits in the R-type message, $R_{old}$, e.g., R-type message 822 in FIG. 8. Circular shifter 914 may then output the shifted version of the P-type message to subtractor 910. Subtractor 910 may then compute a Q-type message using $Q=P-R_{old}$, as is discussed in relation to FIG. 8. This Q-type message may then be output to Q memory 940 to be stored. The Q-type message may also be output to sign update unit 912 so that the values of Min1 and Min2 can be calculated and stored.

Sign update unit 912 may perform various processing steps to update the values of Min1 and Min2, such as computing an absolute value, scaling, truncating or computing a saturated value of the input. For example, the absolute value of a received Q-type message may be computed and scaled by a multiplier. The resulting value may be truncated and output. Sign update unit 912 may update the values of Min1 and Min2 as well as Min1Index, Min2Index, and AccumulatedSign based on the value it receives, and based on previously stored values of Min1, Min2, Min1Index, Min2Index, and AccumulatedSign.

Layered LDPC decoder 900 may include control circuitry to monitor convergence of the decoding process in order to detect when a desired level of convergence has been achieved, or to detect that further iterations are not resulting in an improvement of the decoding process. In some embodiments, layered LDPC decoder 900 may include a syndrome sum calculator 918, an HD monitor 920, and early termination logic 922. Syndrome sum calculator 918 may compute a syndrome sum based on the hard decision signals to determine whether layered LDPC decoder 900 has reached a sufficient decoding accuracy. If a sufficient decoding accuracy has been reached, further processing iterations of layered LDPC decoder 900 may be unnecessary and a corresponding control signal may be provided to early termination logic 922. Hard decision monitor 920 may monitor whether the hard decision metrics corresponding to consecutive iterations improve decoding performance. For example, if decoding metrics associated with the hard decision signals show a large degree of improvement from one iteration to the next, then hard decision monitor 920 may determine that convergence is being reached and that it may be desirable to carry out more iterations to further improve decoding performance. Conversely, if hard decision metrics show little or no improvement, or perhaps even degradation, from one iteration to the next, then hard decision monitor 920 may determine that further iterations are not likely to lead to improvements in the decoding performance. Hard decision monitor 920 may then provide a control signal to early termination logic 922, indicating that the decoding process should be stopped.

Layered LDPC decoder 916 may further include scheduler memory 916. Scheduler memory 916 may provide control signals to circular shifter 914 in order to configure circular shifter 914 to shift the P-type messages received by circular shifter 914 by an appropriate amount. Although not shown in FIG. 9 to avoid overcomplicating the drawing, scheduler memory 916 may also provide similar control signals to R memory 902 and to Q memory 904.

Figure 10:
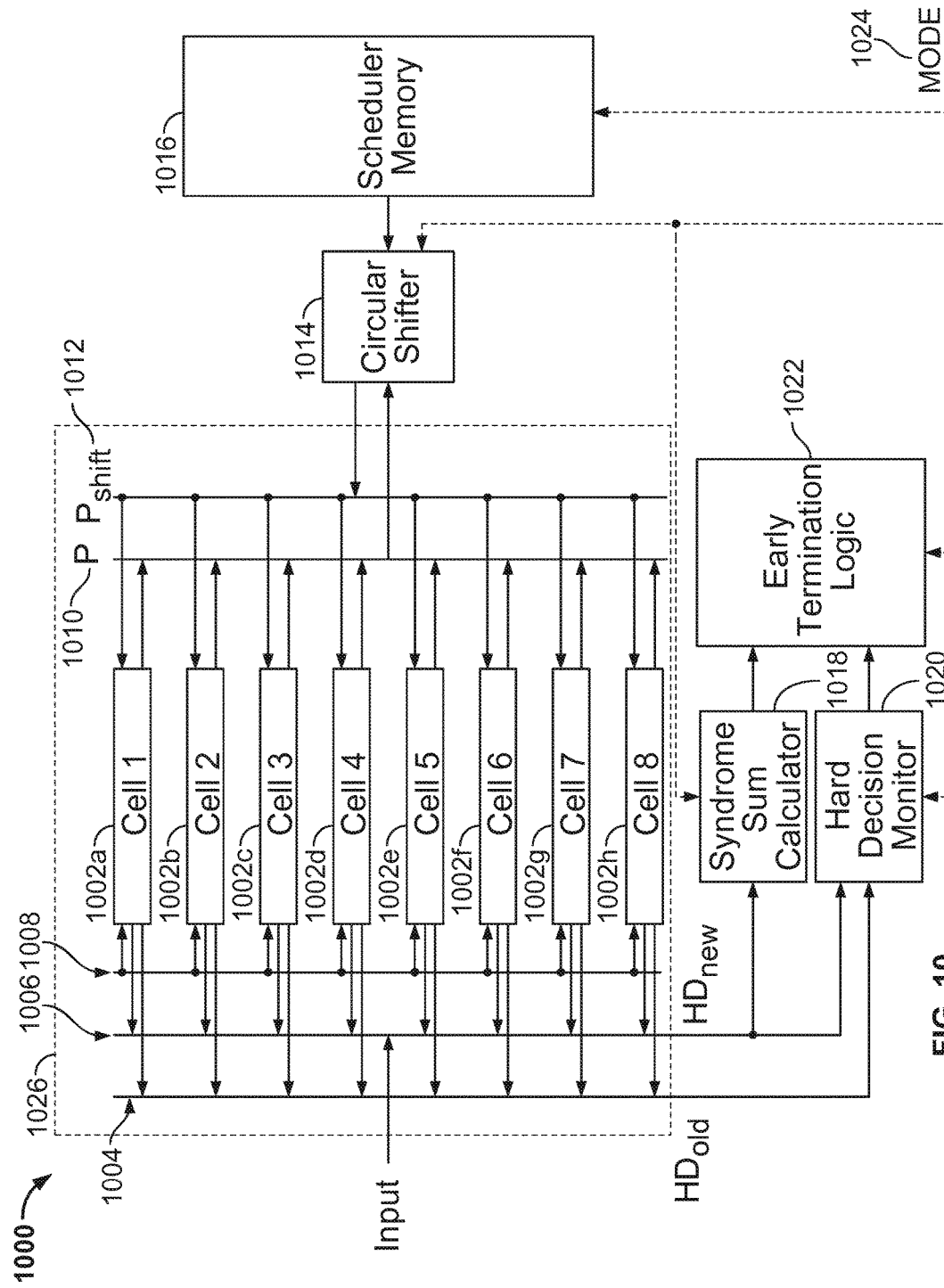
FIG. 10 shows a block diagram of a universal LDPC decoder for decoding LDPC codes with different circulant sizes, in accordance with some embodiments of the present disclosure.

FIG. 10 shows a block diagram of a universal LDPC decoder 1000 for decoding LDPC codes with different circulant sizes, in accordance with some embodiments of the present disclosure. Block diagram 1000 includes common decoding circuitry 1026, a circular shifter 1014, scheduler memory 1016, syndrome sum calculator 1018, hard decision monitor 1020, and early termination logic 1022. Common decoding circuitry 1026 may be configured to perform similar decoding operations as layered LDPC decoder 900 discussed in relation to FIG. 9. However, in contrast to layered LDPC decoder 900, universal LDPC decoder 1000 may consist of common decoding circuitry that can be configured to process a number of LDPC codes with different parameters. For example, in one aspect, common decoding circuitry 1026 may be partitioned into a plurality of processing cells, such as processing cells 1002a-1002h. The partition of processing resources provided by common decoding circuitry 1026 may be performed in accordance with a circulant size associated with a set of supported LDPC codes that are available to be decoded by universal LDPC decoder 1000, such as the long LDPC code and the short LDPC code of the MoCA standard.

In one illustrative example, universal LDPC decoder 1000 may be configured to decode two types of LDPC codes, such as the long and the short LDPC codes discussed in relation to FIGS. 3-4. In one aspect, common decoding circuitry 1026 may need to support the decoding of a single codeword corresponding to the maximum circulant size among the supported LDPC code. For example, if common decoding circuitry 1026 supports the decoding of the long LDPC code (which uses circulant size $C_1=100$) and the short LDPC code (which uses circulant size $C_2=12$), then common decoding circuitry 1026 may need to support at least the decoding of a single codeword associated with circulant size $C_1=100$. When common decoding circuitry 1026 receives a codeword associated with a smaller circulant size, such as control packet 400 of FIG. 4, which includes a set of codewords associated with the short LDPC code, common decoding circuitry 1026 provides more than enough processing resources to process a single codeword with the smaller circulant size. This results from the fact that the decoding complexity of an LDPC code depends on the circulant size, so that a smaller circulant size is less computationally complex than processing a larger circulant size. For example, for the long and the short LDPC code discussed in relation to FIGS. 3-4, processing a single codeword of the short LDPC code with circulant size $C_2=12$ is about one eighth of the complexity of processing a single codeword of the long LDPC code with circulant size $C_1=100$. Specifically, in some embodiments, the processing complexity may scale approximately linearly with the circulant size.

In order to avoid the idling of portions of common decoding circuitry 1026 when a codeword associated with the short LDPC code (or another LPDC with comparably small circulant size) is being processed, universal LDPC decoder 1000 may configure common decoding circuitry 1026 to partition its processing resources such that more than one codeword can be processed simultaneously. In some aspects, common decoding circuitry 1026 may be partitioned into a plurality of cells, such as cells 1002a-1002h (generally cells 1002). Each of cells 1002 is available to process a codeword that is associated with a circulant no larger than a predefined limit. For example, when a lower complexity LDPC code with a first circulant size is received that allows multiple codewords of that LDPC code to be processed simultaneously, common decoding circuitry 1026 may be partitioned into cells that correspond to the first circulant size. The total number of cells that result from this partitioning then corresponds to the maximum number of codewords that can be processed simultaneously. For example, for the case in which the long LDPC code and the short LDPC code are supported to be decoded by common decoding circuitry 1026, common decoding circuitry may support the decoding of a single codeword with circulant size of $C_1=100$. Because, the short LDPC code has a circulant size of $C_2=12$, the resources of common decoding circuitry 1026 may be partitioned into a total of eight cells (i.e., 100 by eight).

Each of cells 1002 may process a single codeword in a similar fashion as layered LDPC decoder 900, discussed in relation to FIG. 9. Input data 1001 is portioned into codewords using input data bus 1008. Input data bus 1008 may be connected to each of cells 1002 and provide a single codeword to each of cells 1002. Although not shown in FIG. 10 to avoid overcomplicating the drawing, each of cells 1002 may compute R-type and Q-type messages using an R memory, a Q memory, an a sign-updating unit. Each of cells 1002 processes the input codeword to obtain a P-type message. The P-type messages across cells 1002 are combined by P-type bus 1010 and provided to circular shifter 1014. Circular shifter 1014 shifts the block of P-type messages that was provided as input and provides a shifted block of P-type messages, $P_{shift}$, to $P_{shift}$ bus 1012, which splits up the shifted block of messages and provides it back to cells 1002. In this fashion, cells 1002 can process a plurality of codewords simultaneously without the need for a dedicated circular shifter for each of cells 1002. Avoiding the need for a separate circular shift may be an implementation advantage because it reduces complexity compared to a naïve implementation that simply uses separate circular shifters for each of the plurality of cells.

Cells 1002 may further provide updated hard decision (HD) signals on hard decision bus 1004 and hard decision bus 1006. The HD signals are computed in a similar way as is discussed in relation to FIG. 9, and the HD signals are provided to syndrome sum calculator 1018 and hard decision monitor 1020. Syndrome sum calculator 1018 may compute a syndrome sum based on the HD signals to determine whether universal LDPC decoder 1000 has reached a sufficient decoding accuracy. If a sufficient decoding accuracy has been reached, further processing iterations of universal LDPC decoder 1000 may be unnecessary and a corresponding control signal may be provided to early termination logic 1022. HD monitor 1020 may monitor whether the hard decision metrics corresponding to subsequent iterations improve decoding performance. For example, if decoding metrics associated with the HD signals show a large degree of improvement from one iteration to the next, then HD monitor 1020 may determine that convergence is being reached and that it may be desirable to carry out further iterations to further improve decoding performance. On the other hand, if hard decision metrics show little or no improvement, or perhaps even degradation, from one iteration to the next, then HD monitor 1020 may determine that further iterations are not likely to lead to further improvements in the decoding performance. HD monitor 1020 may then provide a control signal to early termination logic 1022, indicating that the decoding process should be stopped. In one aspect, syndrome sum calculator 1018 and hard decision monitor perform similar functions, except that syndrome sum calculator 1018 may evaluate decoding accuracy by means of an absolute metric, whereas HD monitor 1020 evaluates relative decoding accuracy by evaluating decoding metrics associated with consecutive iterations.

Scheduler memory 1016 may perform similar functions as scheduler memory 916 discussed in relation to FIG. 9. Scheduler memory 1016 may provide a control signal to circular shifter 1014, which is used by circular shifter 1014 to shift P-type messages received from cells 1002 by an appropriate amount. Although not shown in FIG. 10 to avoid overcomplicating the drawing, scheduler memory 1016 may also provide similar control signals to cells 1002. Scheduler memory 1016 may further receive mode indicator signal 1024 that may indicate which of several types of LDPC codes is currently being decoded. For example, universal LDPC decoder 1000 may support the long LDPC code and the short LDPC code of the MoCA standard, and mode indicator signal 1024 may indicate which one of these two LDPC codes is being decoded. Scheduler memory 1016 may use mode indicator signal 1016 to provide an appropriate shift indication to circular shifter 1014 and cells 1002.

Universal LDPC decoder 1000 may use a form of control signal, such as mode indicator 1024, to configure components of universal LDPC decoder 1000 in accordance with the type of LDPC code that is being decoded (e.g., the short LDPC code versus the long LDPC code). Mode indicator 1024 may be received by schedule memory 1016, syndrome sum calculator 1018, hard decision monitor 1020, early termination logic 1022, and circular shifter 1014 to determine a type of LDPC code being decoded (e.g., whether the short LDPC code or the long LDPC code is being decoded). In accordance with the mode indicated by mode indicator 1024, processing may be adapted such as to tailor it to parameters of the LDPC code being decoded.

Figure 11:
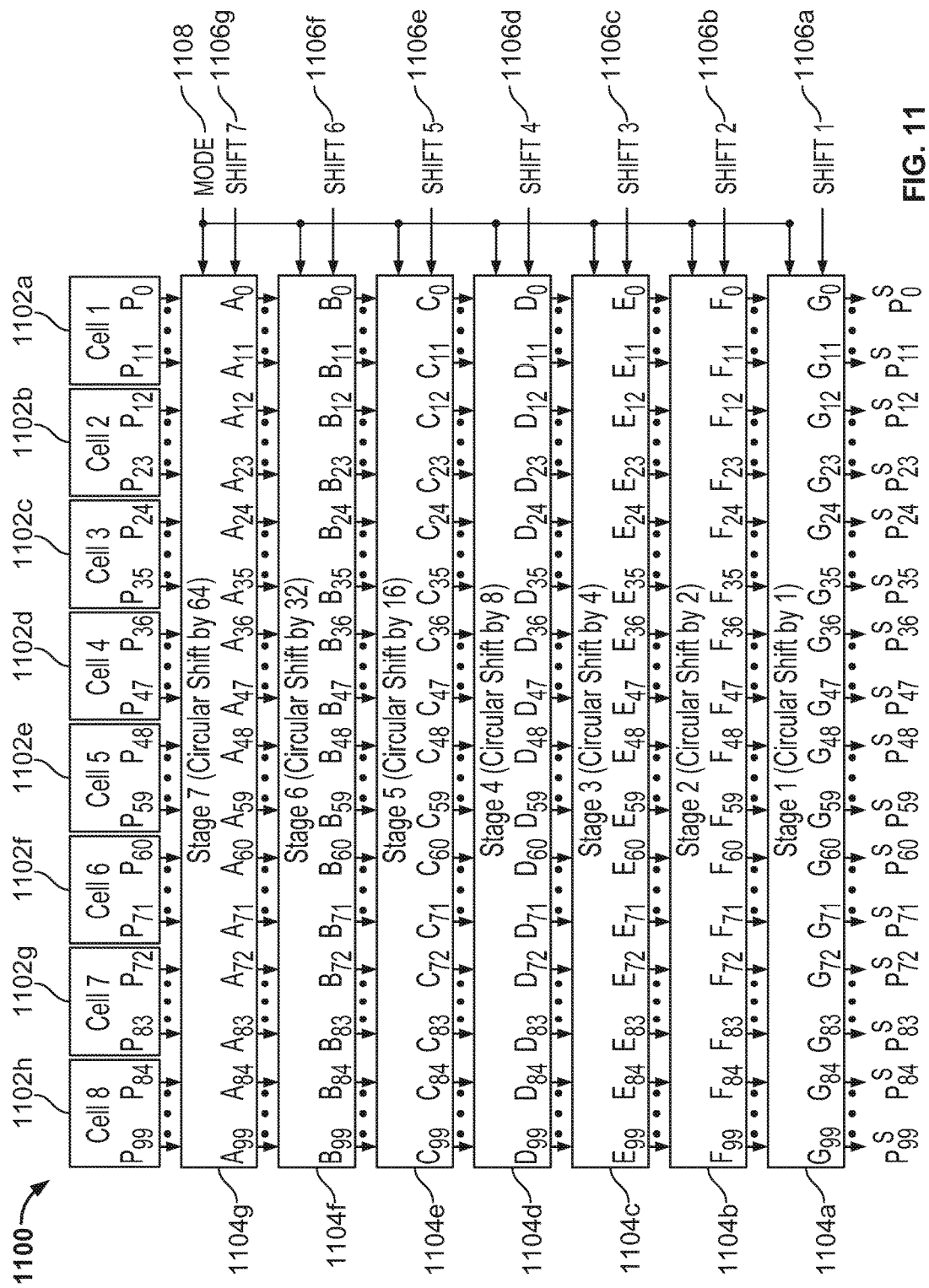
FIG. 11 shows a simplified block diagram of a circular shifter that can be used with LDPC codes of different circulant sizes, in accordance with some embodiments of the present disclosure.

FIG. 11 shows a simplified block diagram of a circular shifter 1100 that can be used with LDPC codes of different circulant sizes, in accordance with some embodiments of the present disclosure. A circular shifter, such as circular shifter 914 or 1014, may be used as part of layered decoding of LDPC codes. In particular, the circular shifter may be used to cyclically shift the bit positions of P-type messages in order to align them with corresponding bit positions in R-type messages. The amount of shift applied by the circular shifter may be determined from properties of the LDPC code, for example, based on the parity check matrix of the LDPC code. In some embodiments, the amount of shift applied by the circular shifter is selected based on a delta shift matrix associated with the LDPC code. Such a delta shift matrix may be generated based on the parity check matrix in shift notation (e.g., parity check matrix 701 in FIG. 7). Each entry in the delta shift matrix may represent a difference between the shift value corresponding to a current non-zero circulant entry in a column of the parity check matrix in shift notation (e.g., the value $C_{i,j}$ in matrix 510 of FIG. 5) and the shift value corresponding to the previous non-zero circulant entry in the same column. This may also be a difference between the shift value corresponding to a current group of check nodes to be processed or updated (e.g., grouped check nodes 722 in FIG. 7) and the shift value corresponding to the previous group of check nodes processed or updated (e.g., grouped check nodes 721 in FIG. 7) in the layered decoding approach discussed in relation to FIG. 8.

In general, a quasi-cyclic parity check matrix associated with a QC-LDPC code may have circulants of size up to $S_c$. For each non-zero circulant entry in the quasi-cyclic parity check matrix in shift notation, the value for the (i,j)-th entry in the delta shift matrix, $D_{i,j}$, may be determined by the equation $$D_{i,j} = \mod(C_{i,j} - C_{p_i,j}, S_c),$$

where $C_{p_i,j}$ is the (nearest) previous non-zero circulant in the j-th column of the parity check matrix in shift notation. For each all-zero circulant entry in the quasi-cyclic parity check matrix in shift notation (i.e., an entry for which $C_{i,j}=-1$), $D_{i,j}$ may be set equal to $-1$. A non-negative integer value in the i-th row and j-th column of the delta shift matrix may represent the additional amount that a circular shifter, such as circular shifter 914 or 1014, must shift the bits of message while processing or updating the group of check nodes associated with the i-th row of the quasi-cyclic parity check matrix and after processing or updating the check nodes associated with the previous non-zero circulant in the j-th column of the quasi-cyclic parity check matrix. The maximum value across all of the entries in a delta shift matrix may be denoted $D_{max}$. This may represent the maximum amount of shift that must be accommodated by a circular shifter to appropriately shift the bits of any message input to the circular shifter. In general, $D_{max}$ may be equal to $S_c$, unless a specific LDPC code has specifically been designed to be associated with a smaller value of $D_{max}$.

A circular shifter that may be used in decoding a QC-LDPC codeword may include $S_c$ inputs for an input message, $S_c$ outputs for an output message, and $\lceil \log_2 D_{max} \rceil$ steps consisting of $S_c$ multiplexers for each step (i.e., a $\lceil \log_2 D_{max} \rceil$-step $S_c \times S_c$ circular shifter, where the number of steps is set at the smallest integer not less than $\log_2 D_{max}$ using the ceiling function). In addition, the circular shifter may have $\lceil \log_2 D_{max} \rceil$ inputs to determine the amount by which to shift the input message bits prior these bits being output as the bits of the output message. A reduction in the number of steps required to construct a circular shifter may allow for a reduction in the number of multiplexers and hence may also allow for a reduction in complexity of the circular shifter.

In some embodiments that use multiple LDPC codes, such as the long LDPC code and the short LDPC code in the MoCA standard, the amount of shift to be applied by circular shifter 1014 of universal LDPC decoder 1000 may depend on whether the long LDPC code or the short LDPC code is being decoded. In some implementations, separate circular shifters may be used, one that to be used in instances in which the long LDPC code is being processed, and a separate one to be used in instances when the short LDPC code is being processed. While this may be appropriate in some implementations, the use of separate circular shifters comes at the expense of implementation complexity, because at any given time only a single one of the dedicated circular shifters will be used.

In one aspect, universal LDPC decoder 1000 may avoid this duplication of hardware by using a circular shifter 1100 that can be configured to work with either the long LDPC code or the short LDPC code. Circular shifter 1100 may be used with universal LDPC decoder 1000. Specifically, the input to circular shifter 1100 may come from a plurality of cells 1102a-1102h, which may correspond to cells 1002a-1002h in FIG. 10. The input to circular shifter 1100 may be a P-type signal, and each cell may provide a predefined number of such P-type signals. For example, the number of such input signals may correspond to the circulant size that was used to partition decoding resources into cells 1002a-1000h. For the long LDPC code and the short LDPC code, the number of inputs may correspond to $C_2=12$, i.e., the circulant size of the short LDPC code. Accordingly, cell 1 (1102a) may provide signals $P_0, \ldots, P_{11}$, cell 2 (1102b) may provide signals $P_{12}, \ldots, P_{23}$, etc.

The shift to be applied by circular shifter 1100 may be applied to the input signal using a plurality of stages 1104a-1104g. Each of stages 1104a-1104g applies a shift to the input signal that corresponds to a specific power of two. For example, stage 7 (1104g) may apply a circular shift by 64 entries, stage 6 (1104f) may apply a circular shift by 32 entries, and stage 1 (1104a) may apply a shift by a single entry. Stages 1104a-1104g may be combined to achieve any shift from zero to 127, in this example. Whether or not a specific one of stages 1104-1104g should be used may be determined based on a binary control signal that indicates whether the stage should be activated. For example, if a circular shift of 42 should be applied by circular shifter 1100, control signal 1106b ("shift 2"), control signal 1106d ("shift 8"), and control signal 1106f ("shift 32") may be activated and the remaining control signals may be set as inactive. In some aspects, the maximum shift required for the decoding of the LDPC code may be smaller than the maximum shift supported by the circular shifter 1100. For example, for the decoding of long LDPC code and short LDPC code, a maximum shift of $C_1=100$ may suffice, i.e., a shift that corresponds to the larger one of the two circulant sizes associated with the long LDPC code and the short LDPC code.

Circular shifter 1100 further uses mode control signal 1108 to modify the circular shift applied by circular shifter 1100 depending on the type of LDPC code being decoded. For example, assume that the long LDPC code and the short LDPC code of the MoCA standard are to be decoded. When the long LDPC code is being decoded, circular shifter 1100 may process the input signal in accordance with the previous discussion. However, when the short LDPC is being decoded, circular shifter 1100 needs to adjust its operation to the shorter circular size. In particular, because the short LDPC code is associated with a circulant size of 12, the maximum shift that may need to be applied by circular shifter 1100 is $D_{max}=C_2=12$. Accordingly, stage 7 (1104g), stage 6 (1104f) and stage 5 (1104e), all of which shift the input signal by more than 12 entries, will never be used and may be deactivated. The remaining stages 1104a-1104d may be used to apply to any circular shift up to 12 entries. However, stages 1104a-1104d need to be modified because the shift applied by stages 1104a-1104d, when decoding the short LDPC code, needs to be circular with respect to input signals $P_0, \ldots, P_{11}, P_{12}, \ldots, P_{23}, \ldots, P_{84}, \ldots, P_{99}$, respectively. For instance, if a circular shift of 5 is to be applied with respect to the P-type input signal, the result will be $P_4, \ldots, P_{11}, P_0, \ldots, P_3, P_{17}, \ldots, P_{23}, P_{12}, \ldots, P_{16}$, etc. That is, the circular shift is being applied with respect to each group of 12 signals and not with respect to the aggregated P-type signal with 100 entries.

Figure 12:
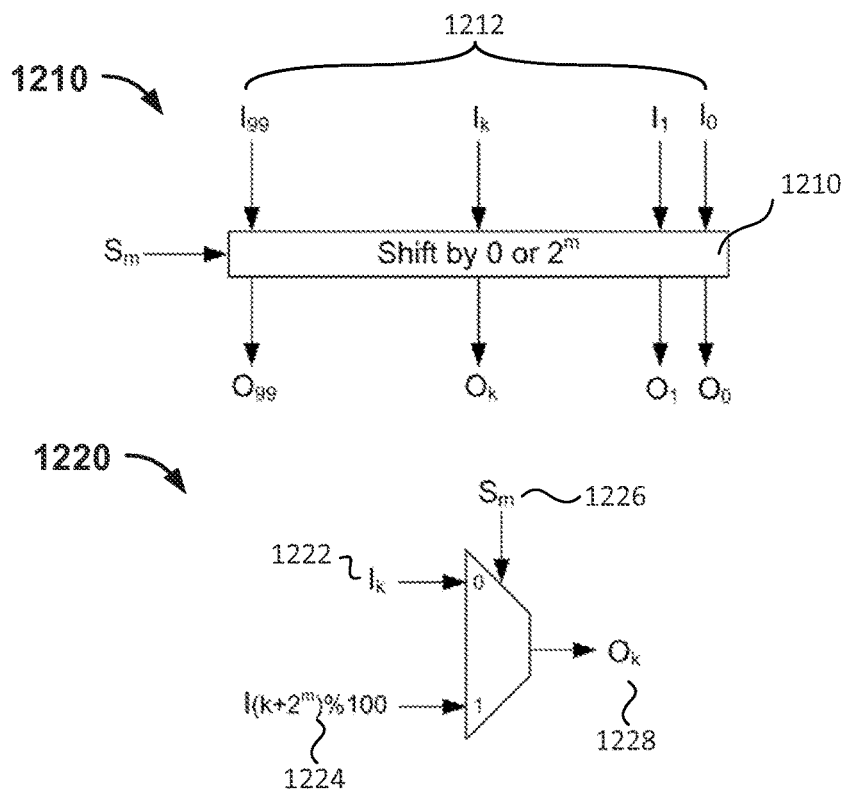
FIG. 12 shows a simplified block diagram of a multiplexer for use in a circular shifter, in accordance with some embodiments of the present disclosure.

FIG. 12 shows a simplified block diagram of a multiplexer for use in a circular shifter, in accordance with some embodiments of the present disclosure. Shifting stage 1210 may shift an input signal 1212 by an amount that is equal to a power of two, e.g., $2^m$, where m is an integer. The result is output signal 1214, shifted circularly by the corresponding amount. Shifting stage 1210 may be similar to shifting stages 1104a-1104g discussed in relation to FIG. 11. In some aspects, the shifting may be implemented by means of multiplexers, such as multiplexer 1220. The number of multiplexers needed may be equal to the number of input signals, e.g., $C_1$=100 multiplexers may be needed for shifting stage 1210 because input signal 1212 includes a total of $C_1$=100 entries $I_0, \ldots, I_{99}$.

The input to multiplexer 1220 may include a first input signal and second input signal. The first input signal may be equal to $I_k$ and may be used in case that no circular shift is to be applied by shifting stage 1210. The second input may be equal to $I_{mod(k+2^m,100)}$, which corresponds to the circularly shifted input signal. Control signal 1226 is used to select the first input signal 1222 when no circular shift is to be applied and second input signal 1224 if a circular shift is to be applied. Multiplexer 1220 may be used in circular shifter 1100 for the stages that need not be adapted to mode control signal 1024 in FIG. 10, i.e., stages 1104e-1104g, which shift by 64 entries, 32 entries, and 16 entries, respectively. Multiplexer 1220 may not be used for the reaming stages because the way in which the input signal is circularly shifted depends on the mode control signal, as discussed above and below.

Figure 13:
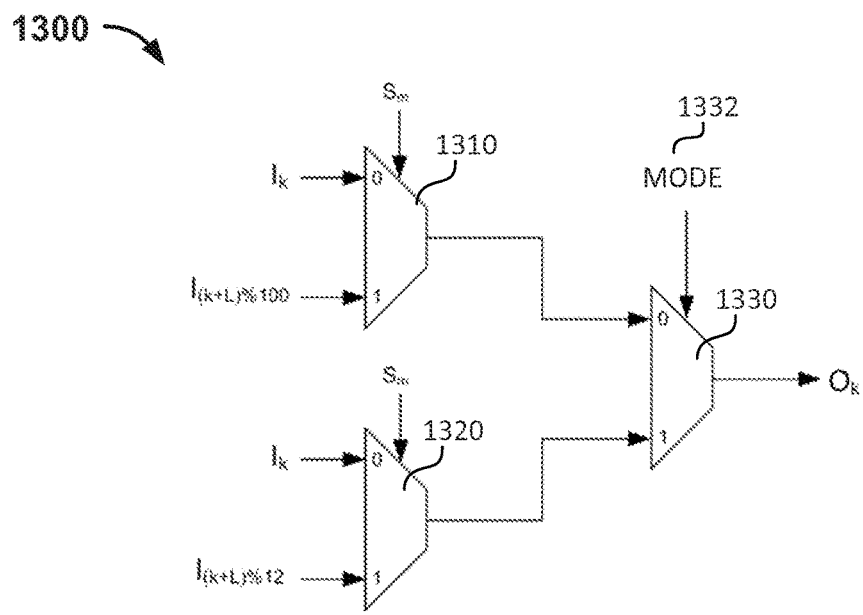
FIG. 13 shows a simplified block diagram of a multiplexer structure for use with a universal LDPC decoder, in accordance with some embodiments of the present disclosure.

FIG. 13 shows a simplified block diagram of a multiplexer structure 1300 for use with universal LDPC decoder 1000, in accordance with some embodiments of the present disclosure. Multiplexer structure 1300 includes three multiplexers, multiplexer 1310, multiplexer 1320, and multiplexer 1330. Multiplexer 1310 may be used to perform the circular shifting when the long LDPC code is being decoded and multiplexer 1320 may be used when the short LDPC code is being decoded. Multiplexer 1330 may be used to select between the output of multiplexer 1310 and multiplexer 1320 depending on mode control signal 1332, which may be similar to mode control signal 1024 in FIG. 10.

A first input to multiplexers 1310 and 1320 is identical and corresponds to $I_k$, i.e., the case in which no circular shift is to be applied. A second input to multiplexers 1310 and 1320 corresponds to a signal for which a circular shift is to be applied, and these signals are different for multiplexers 1310 and 1320. For multiplexer 1310 the second input signal may be equal to $I_{mod(k+2^m,C_1)}$, whereas the second input signal for multiplexer 1320 may be equal to $I_{mod(k+2^m,C_2)}$. Applying the modulo operation for the selection of the input signal ensures that the circular shifting is performed with respect to the grouped P-shift signal, i.e., within groups of $C_2$=12 for the short LDPC code and with respect to a single group of $C_1$=100 for the long LDPC code.

Figure 14:
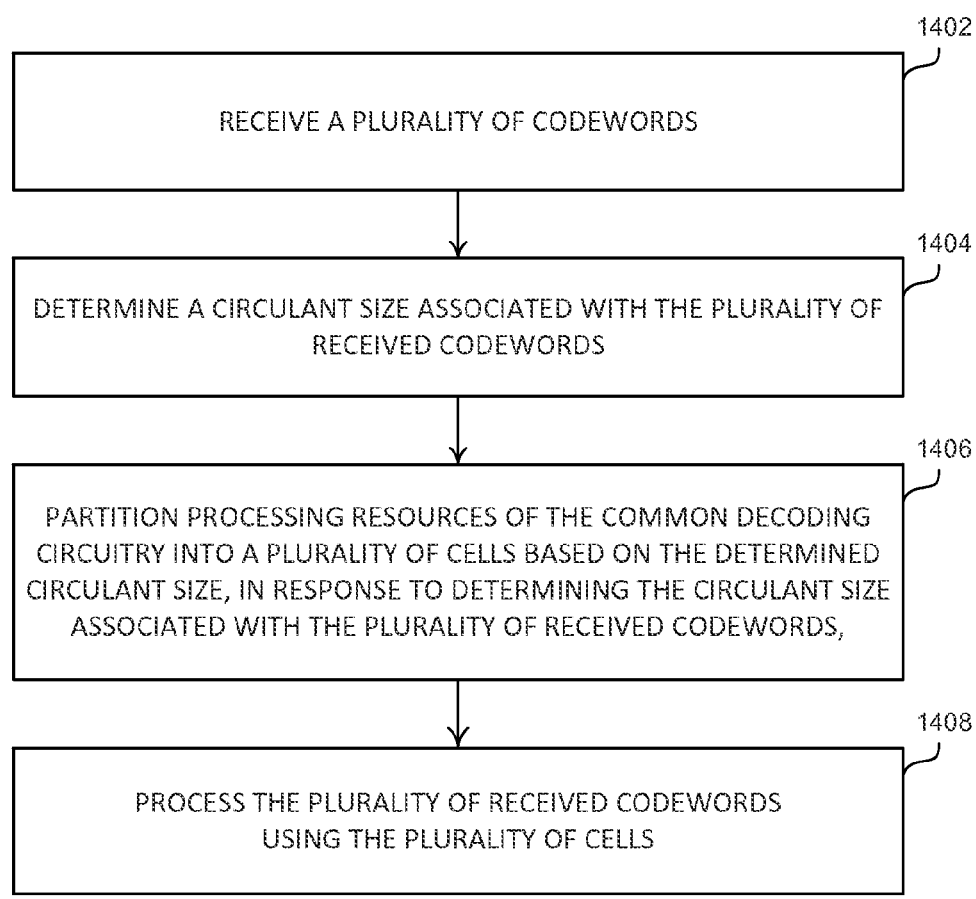
FIG. 14 shows a high-level flow chart of a process for decoding LDPC codes with different circulant sizes using common decoding circuitry, in accordance with some embodiments of the present disclosure.

FIG. 14 shows a high-level flow chart of a process 1400 for decoding LDPC codes with different circulant sizes using common decoding circuitry, in accordance with some embodiments of the present disclosure. LDPC decoder 108 may execute process 1400 by, at 1402, receiving a plurality of codewords. Process 1400, at 1404, may determine a circulant size associated with the plurality of received codewords. At 1406, process 1400 may partition processing resources of the common decoding circuitry into a plurality of cells based on the determined circulant size, in response to determining the circulant size associated with the plurality of received codewords. At 1408, process 1400 may process the plurality of received codewords using the plurality of cells.

At 1402, LDPC decoder 108 may receive a plurality of codewords corresponding to an LDPC code. As is described in relation to FIG. 1, the plurality of codewords may be received from a demodulator, such as demodulator 116. The plurality of received codewords may be corrupted due to interference, noise, or other physical phenomena associated with transmission channel 184. The received codewords may include payload data and parity data, such as payload data 202 and parity date 204. In some aspects, the received plurality of codewords may correspond to data packet 300, control packet 400, or any other suitable packet of data and/or control information.

At 1404, process 1400 may determine a circulant size associated with the plurality of received codewords. For example, in some embodiments, process 1400 may determine the circulant size by analyzing a packet that includes the received codewords, such as data packet 300 or control packet 400. As is discussed in relation to FIGS. 3-4, data packet 300 and control packet 400 may each include payload and parity data that consists of a number of circulants. The number of circulants making up payload data 202 may be different from the number of circulants making up parity data 204. In some aspects, the circulant size associated with data packet 300 may be different from the circulant size associated with control packet 400.

At 1406, process 1400 may partition processing resources of common decoding circuitry into a plurality of cells based on the determined circulant size, in respond to determining the circulant size associated with the plurality of codewords. For example, process 1400 may utilize universal LDPC decoder 1000 and may partition common decoding circuitry 1026 into cells 1002a-1002h based on the determined circulant size. In one aspect, the partition may be performed such that each of cells 1002 is available to process the determined circulant size. For example, if decoding circuitry 1026 supports the decoding of a first circulant size $C_1$ when not partitioned (e.g., when there is only a single cell), then the number of cells may be determined as $$\left\lceil \frac{C_1}{C_d} \right\rceil$$

where $C_d$ denotes the determined circulant size. In an embodiment in which universal LDPC decoder decodes the short and the long LDPC code of the MoCA standard, and a plurality of codewords of the short LDPC code are received, the number of cells may be equal to $$\left\lceil \frac{C_1}{C_2} \right\rceil = \left\lceil \frac{100}{12} \right\rceil = 9.$$

Alternatively, the ceiling operation may be replaced by a floor operation, and one of the processing cells may be designed to support a slightly larger circulant size. For example, in the above example, decoding circuitry 1026 partitioned into eight cells may be used, seven of which use a circulant size of 12 and one of which uses a circulant size of 16.

At 1408, process 1400 may process the plurality of received codewords simultaneously using the plurality of cells. Cells 1002 of decoding circuitry 1026 may use an iterative message-passing algorithm to decode the received plurality of codewords. A layered decoding approach, similar to the decoding approaches discussed in relation to FIGS. 9-10, may be used. A circular shifter, similar to circular shifter 1100, may be used to shift P-type messages received from cells 1002, such as to align these P-type messages among circulants that are being processed using the layered decoding approach. The operation of the circular shifter may depend on the type of LDPC code being decoded. For example, process 1400 may determine that the short LDPC code of the MoCA standard is being decoded and configure the circular shifter to apply a circular shift modulo the circulant size of the short LDPC code (i.e., using a circulant size of $C_2=12$). Process 1400 may support the decoding of a wide range of codes with different circulant sizes, without departing from the scope of the present disclosure.

At 1408, process 1400 may further process the received plurality of codewords to determine metrics that reflect convergence properties. In one aspect, an absolute metric may be computed that is representative of a degree of accuracy associated with the decoded codewords. For instance, a syndrome sum metric may be used. If the metric exceeds a desired level of decoding accuracy, process 1400 may determine that a sufficient degree of decoding accuracy has been achieved and terminate the decoding process. Additionally or alternatively, process 1400 may use a relative convergence metric that is representative of the improvement in decoding accuracy that is achieved from one iteration to the next. For example, metrics derived by a hard decision monitor may be used, as is discussed in relation to FIG. 10. In one aspect, if consecutive iterations do not show sufficient improvements in terms of decoding accuracy, process 1400 may determine that either convergence is not being achieved or that a sufficient level of convergence has been achieved already. Process 1400 may terminate the decoding process in response to either or both of these conditions.

Figure 15:
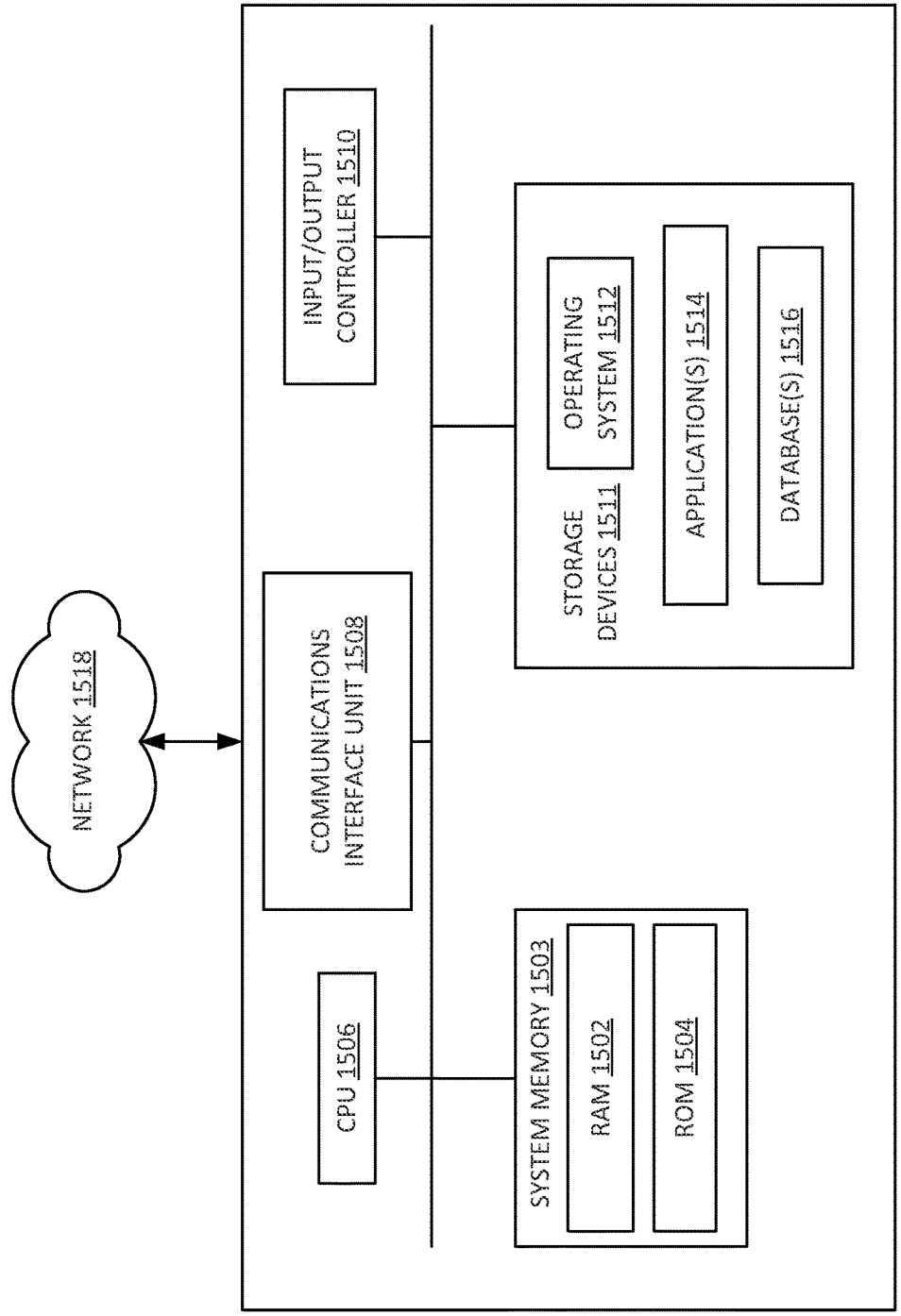
FIG. 15 shows a block diagram of a computing device, for performing any of the processes described herein, in accordance with an embodiment of the present disclosure.

FIG. 15 is a block diagram 1500 of a computing device, such as any of the user equipment devices of FIG. 1, for performing any of the processes described herein, in accordance with an embodiment of the disclosure. Each of the components of these systems may be implemented on one or more computing devices 1500. In certain aspects, a plurality of the components of these systems may be included within one computing device 1500. In certain embodiments, a component and a storage device 1511 may be implemented across several computing devices 1500.

The computing device 1500 comprises at least one communications interface unit 1508, an input/output controller 1510, system memory 1503, and one or more data storage devices 1511. The system memory 1503 includes at least one random access memory (RAM 1502) and at least one read-only memory (ROM 1504). All of these elements are in communication with a central processing unit (CPU 1506) to facilitate the operation of the computing device 1500. The computing device 1500 may be configured in many different ways. For example, the computing device 1500 may be a conventional standalone computer, or, alternatively, the functions of computing device 1500 may be distributed across multiple computer systems and architectures. In FIG. 15, the computing device 1500 is linked, via network 1518 or local network, to other servers or systems.

The computing device 1500 may be configured in a distributed architecture, wherein databases and processors are housed in separate units or locations. Some units perform primary processing functions and contain at a minimum a general controller or a processor and a system memory 1503. In distributed architecture embodiments, each of these units may be attached via the communications interface unit 1508 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to Ethernet, SAP, SAS™, ATP, BLUETOOTH™, GSM and TCP/IP.

The CPU 1506 comprises a processor, such as one or more conventional microprocessors and one or more supplementary co-processors such as math co-processors for offloading workload from the CPU 1506. The CPU 1506 is in communication with the communications interface unit 1508 and the input/output controller 1510, through which the CPU 1506 communicates with other devices such as other servers, user terminals, or devices. The communications interface unit 1508 and the input/output controller 1510 may include multiple communication channels for simultaneous communication with, for example, other processors, servers or client terminals.

The CPU 1506 is also in communication with the data storage device 1511. The data storage device 1511 may comprise an appropriate combination of magnetic, optical or semiconductor memory, and may include, for example, RAM 1502, ROM 1504, flash drive, an optical disc such as a compact disc or a hard disk or drive. The CPU 1506 and the data storage device 1511 each may be, for example, located entirely within a single computer or other computing device, or connected to each other by a communication medium, such as a USB port, serial port cable, a coaxial cable, an Ethernet cable, a telephone line, a radio frequency transceiver or other similar wireless or wired medium or combination of the foregoing. For example, the CPU 1506 may be connected to the data storage device 1511 via the communications interface unit 1508. The CPU 1506 may be configured to perform one or more particular processing functions.

The data storage device 1511 may store, for example, (i) an operating system 1512 for the computing device 1500; (ii) one or more applications 1514 (e.g., a computer program code or a computer program product) adapted to direct the CPU 1506 in accordance with the systems and methods described here, and particularly in accordance with the processes described in detail with regard to the CPU 1506; or (iii) database(s) 1516 adapted to store information that may be utilized to store information required by the program.

The operating system 1512 and applications 1514 may be stored, for example, in a compressed, an uncompiled and an encrypted format, and may include computer program code. The instructions of the program may be read into a main memory of the processor from a computer-readable medium other than the data storage device 1511, such as from the ROM 1504 or from the RAM 1502. While execution of sequences of instructions in the program causes the CPU 1506 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to synchronization signal acquisition as described herein. The program also may include program elements such as an operating system 1512, a database management system and "device drivers" that allow the processor to interface with computer peripheral devices (e.g., a video display, a keyboard, a computer mouse, etc.) via the input/output controller 1510.

The term "computer-readable medium" as used herein refers to any non-transitory medium that provides or participates in providing instructions to the processor of the computing device 1500 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, a hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer-readable media may be involved in carrying one or more sequences of one or more instructions to the CPU 1506 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 1500 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only by the claims which follow.

What is claimed is:

1. A method for decoding low density parity check (LDPC) codes with different circulant sizes using common decoding circuitry, the method comprising:
   receiving a plurality of codewords;
   determining, using control circuitry, one of a first mode of operation and a second mode of operation based on a circulant size associated with the plurality of received codewords, wherein:
   the first mode of operation is associated with receiving a plurality of codewords of a first LDPC code and the second mode of operation is associated with receiving a single codeword of a second LDPC code;
   in response to determining the circulant size associated with the plurality of received codewords, partitioning processing resources of the common decoding circuitry into a plurality of cells based on the determined circulant size; and
   processing the plurality of received codewords using the plurality of cells.

2. The method of claim 1, wherein a number of cells in the plurality of cells is selected to be equal to a number of codewords in the plurality of received codewords.

3. The method of claim 1, wherein processing the plurality of received codewords comprises processing the plurality of codewords using an iterative message-passing algorithm.

4. The method of claim 1, wherein the plurality of codewords corresponds to the first LDPC code, the plurality of codewords is of a first type, and the method further comprises:
   receiving a codeword of a second type corresponding to the second LDPC code;
   determining a circulant size associated with the received codeword of the second type, wherein the circulant size associated with the received codeword of the second type is larger than the circulant size associated with the plurality of received codewords of the first type;
   in response to determining the circulant size associated with the received codeword of the second type, processing the received codeword of the second type jointly using the partitioned processing resources of the common decoding circuitry.

5. The method of claim 1, wherein the first LDPC code is associated with a code rate of 75% and the second LDPC code is associated with a code rate of 85%.

6. The method of claim 1, wherein the first LDPC code is associated with a circulant size that is smaller than a circulant size associated with the second LDPC code.

7. The method of claim 1, wherein processing the plurality of codewords comprises:
   processing the plurality of codewords simultaneously using the plurality of cells to obtain a plurality of processed codewords; and
   circularly shifting the plurality of processed codewords using a circular shifter based on the determined circulant size associated with the plurality of codewords.

8. The method of claim 1, wherein the circulant size associated with the plurality of codewords is determined based on a control signal.

9. The method of claim 1, wherein processing the plurality of codewords comprises:
   determining whether an early termination criterion is satisfied, wherein the early termination criterion is based on the circulant size associated with the plurality of codewords.

10. A system for decoding low density parity check (LDPC) codes with different circulant sizes, the system comprising:
    common decoding circuitry configured to process a plurality of codewords; and
    control circuitry configured to:
    receive the plurality of codewords;
    determine one of a first mode of operation and a second mode of operation based on a circulant size associated with the plurality of received codewords, wherein:

the first mode of operation is associated with receiving a plurality of codewords associated with a first LDPC code and the second mode of operation is associated with receiving a single codeword associated with a second LDPC code;

partition processing resources of the common decoding circuitry into a plurality of cells based on the determined circulant size, in response to determining the circulant size associated with the plurality of received codewords; and cause the common decoding circuitry to process the plurality of received codewords using the plurality of cells.

11. The system of claim 10, wherein a number of cells in the plurality of cells is selected to be equal to a number of codewords in the plurality of received codewords.

12. The system of claim 10, wherein the common decoding circuitry is further configured to process the plurality of codewords using an iterative message-passing algorithm.

13. The system of claim 10, wherein the plurality of codewords corresponds to the first LDPC code, the plurality of codewords is of a first type, and the control circuitry is further configured to:

receive a codeword of a second type corresponding to the second LDPC code;

determine a circulant size associated with the received codeword of the second type, wherein the circulant size associated with the received codeword of the second type is larger than the circulant size associated with the plurality of received codewords of the first type; and cause the common decoding circuitry to process the received codeword of the second type jointly using the partitioned processing resources of the common decoding circuitry, in response to determining the circulant size associated with the received codeword of the second type.

14. The system of claim 10, wherein the first LDPC code is associated with a code rate of 75% and the second LDPC code is associated with a code rate of 85%.

15. The system of claim 10, wherein the first LDPC code is associated with a circulant size that is smaller than a circulant size associated with the second LDPC code.

16. The system of claim 10, wherein the common decoding circuitry is further configured to process the plurality of codewords by:

processing the plurality of codewords simultaneously using the plurality of cells to obtain a plurality of processed codewords; and circularly shifting the plurality of processed codewords using a circular shifter based on the determined circulant size associated with the plurality of codewords.

17. The system of claim 10, wherein the circulant size associated with the plurality of codewords is determined based on a control signal.

18. The system of claim 10, wherein the control circuitry is further configured to:

determine whether an early termination criterion is satisfied, wherein the early termination criterion is based on the circulant size associated with the plurality of codewords.

19. A method for decoding low density parity check (LDPC) codes with different circulant sizes using common decoding circuitry, the method comprising:

receiving a plurality of codewords;

determining, using control circuitry, a circulant size associated with the plurality of received codewords;

in response to determining the circulant size associated with the plurality of received codewords, partitioning processing resources of the common decoding circuitry into a plurality of cells based on the determined circulant size;

processing the plurality of codewords concurrently using the plurality of cells to obtain a plurality of processed codewords; and circularly shifting the plurality of processed codewords using a circular shifter based on the determined circulant size associated with the plurality of codewords.

20. A system for decoding low density parity check (LDPC) codes with different circulant sizes, the system comprising:

common decoding circuitry configured to process a plurality of codewords; and control circuitry configured to:

receive the plurality of codewords;

determine a circulant size associated with the plurality of received codewords;

partition processing resources of the common decoding circuitry into a plurality of cells based on the determined circulant size, in response to determining the circulant size associated with the plurality of received codewords;

process the plurality of codewords concurrently using the plurality of cells to obtain a plurality of processed codewords; and circularly shift the plurality of processed codewords using a circular shifter based on the determined circulant size associated with the plurality of codewords.

* * * * *